United States Patent
Marin et al.

(10) Patent No.: US 12,230,564 B2
(45) Date of Patent: Feb. 18, 2025

(54) PACKAGE SUBSTRATE Z-DISAGGREGATION WITH LIQUID METAL INTERCONNECTS

(71) Applicant: Intel Corporation, Santa Clara, CA (US)

(72) Inventors: Brandon Christian Marin, Gilbert, AZ (US); Tarek A. Ibrahim, Mesa, AZ (US); Karumbu Nathan Meyyappan, Portland, OR (US); Valery Ouvarov-Bancalero, Scottsdale, AZ (US); Dingying Xu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 653 days.

(21) Appl. No.: 17/345,912

(22) Filed: Jun. 11, 2021

(65) Prior Publication Data

US 2022/0399263 A1 Dec. 15, 2022

(51) Int. Cl.
*H01L 23/498* (2006.01)
*H01L 21/48* (2006.01)
(Continued)

(52) U.S. Cl.
CPC .... *H01L 23/49883* (2013.01); *H01L 21/4853* (2013.01); *H01L 21/4857* (2013.01);
(Continued)

(58) Field of Classification Search
CPC ........... H01L 23/49883; H01L 23/5381; H01L 23/5383; H01L 23/5384; H01L 23/5385;
(Continued)

(56) References Cited

U.S. PATENT DOCUMENTS 9,835,648 B2  12/2017  Baskaran et al.
2007/0226997 A1  10/2007  Brodsky et al.
(Continued)

FOREIGN PATENT DOCUMENTS

KR  1020090014001 A  2/2009

OTHER PUBLICATIONS

PCT International Search Report and Written Opinion issued in PCT/US2022/019193, dated Jun. 17, 2022; 10 pages.
International Preliminary Report on Patentability for Application No. PCT/US2022/019193, mailed on Nov. 21, 2023, 7 Pages.
(Continued)

*Primary Examiner* — Peniel M Gumedzoe
(74) *Attorney, Agent, or Firm* — Alliance IP, LLC

(57) ABSTRACT

A z-disaggregated integrated circuit package substrate assembly comprises a first substrate component (a coreless patch), a second substrate component (a core patch), and a third substrate component (an interposer). The coreless patch comprises thinner dielectric layers and higher density routing and can comprise an embedded bridge to allow for communication between integrated circuit dies attached to the coreless patch. The core layer acts as a middle layer interconnect between the coreless patch and the interposer and comprises liquid metal interconnects to connect the core patch physically and electrically to the coreless patch and the interposer. Core patch through holes comprise liquid metal plugs. Some through holes can be surrounded by and coaxially aligned with magnetic plugs to provide improved power signal delivery. The interposer comprises thicker dielectric layers and lower density routing. The substrate assembly can reduce cost and provide improved overall yield and electrical performance relative to monolithic substrates.

25 Claims, 14 Drawing Sheets

(51) Int. Cl.
   *H01L 23/00* (2006.01)
   *H01L 23/538* (2006.01)
   *H01L 25/00* (2006.01)
   *H01L 25/065* (2023.01)
   *H01L 25/18* (2023.01)

(52) U.S. Cl.
   CPC ........ *H01L 21/486* (2013.01); *H01L 21/4867* (2013.01); *H01L 23/5381* (2013.01); *H01L 23/5383* (2013.01); *H01L 23/5384* (2013.01); *H01L 23/5385* (2013.01); *H01L 23/5386* (2013.01); *H01L 24/16* (2013.01); *H01L 25/0655* (2013.01); *H01L 25/18* (2013.01); *H01L 25/50* (2013.01); *H01L 2224/16227* (2013.01)

(58) Field of Classification Search
   CPC ............. H01L 23/5386; H01L 21/4853; H01L 21/4857; H01L 21/486; H01L 21/4867; H01L 24/16; H01L 25/0655; H01L 25/18; H01L 25/50; H01L 2224/16227
   See application file for complete search history.

(56) References Cited

U.S. PATENT DOCUMENTS

| | | |
|---|---|---|
| 2009/0001576 A1 | 1/2009 | Tuli et al. |
| 2009/0273083 A1* | 11/2009 | Sauciuc ................ H05K 3/321 |
| | | 257/E23.079 |
| 2011/0043234 A1* | 2/2011 | Lee ...................... G01R 1/0466 |
| | | 324/755.09 |
| 2011/0127664 A1 | 6/2011 | Antesberger et al. |
| 2020/0303310 A1 | 9/2020 | Alur et al. |

OTHER PUBLICATIONS

U.S. Appl. No. 16/902,048, filed Jun. 15, 2020 entitled, Low Force Liquid Metal Interconnect Solutions (42 pages).

* cited by examiner

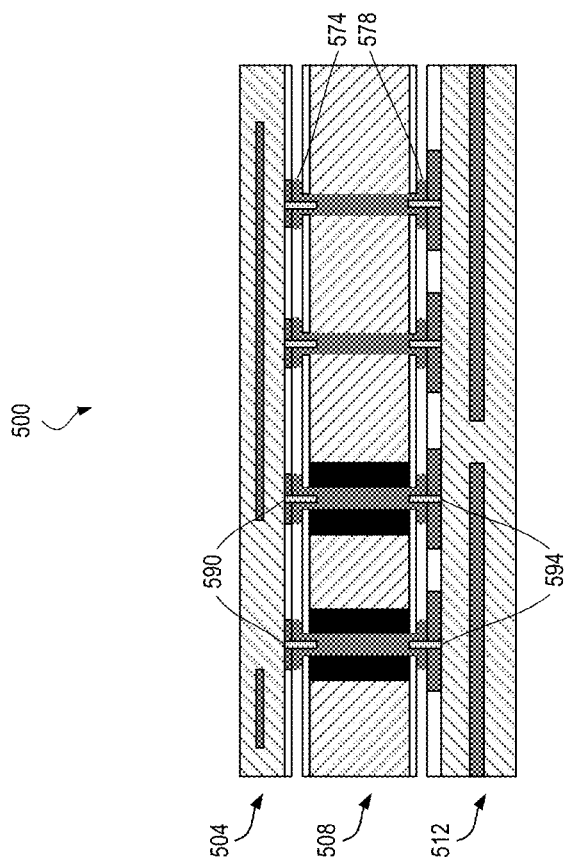
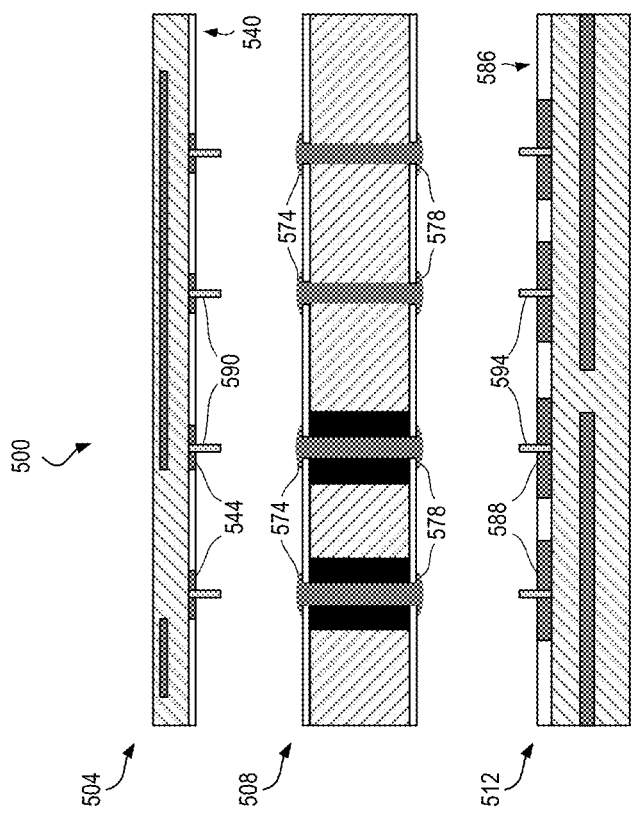
FIG. 5B
FIG. 5A

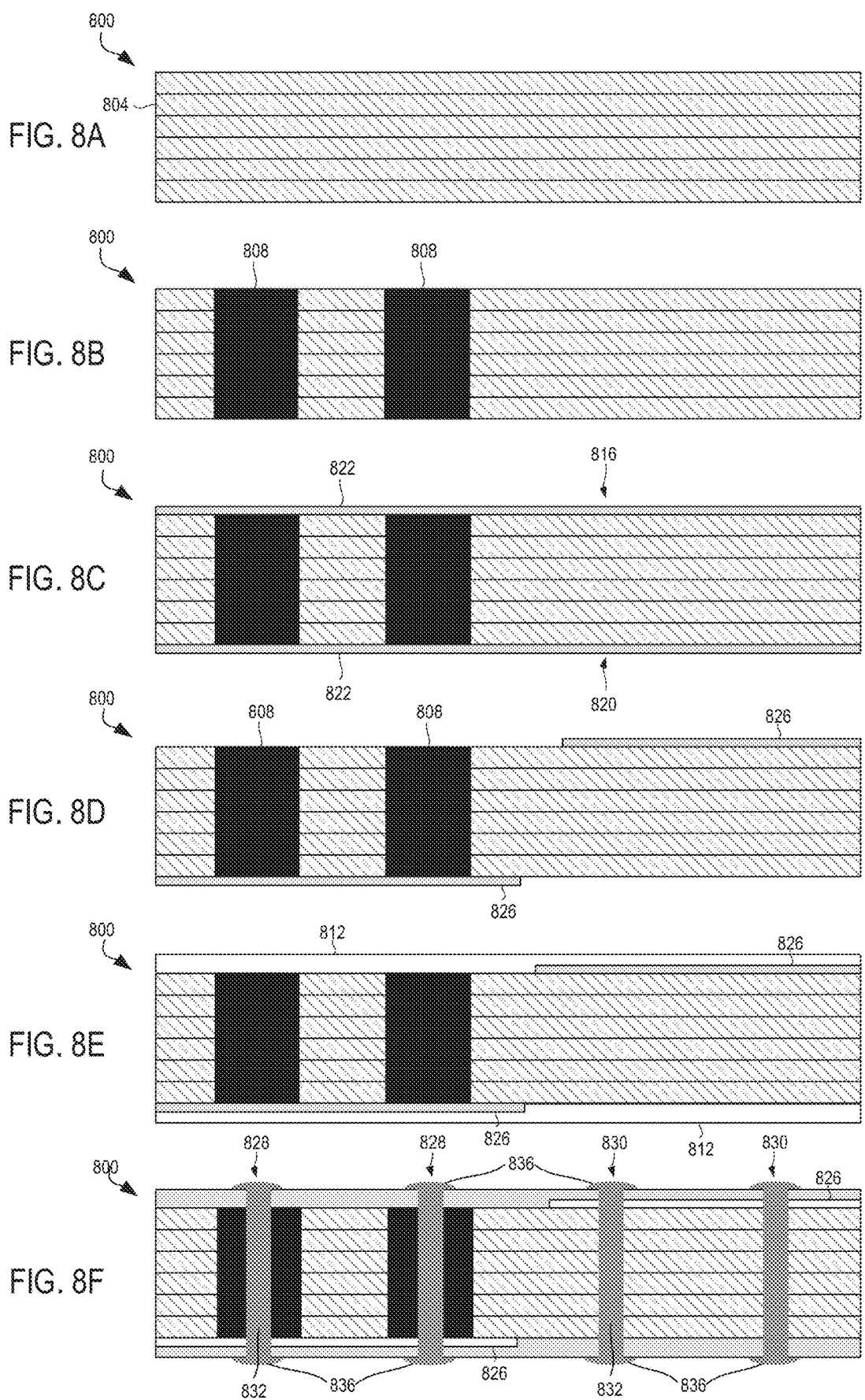

900

```
┌─────────────────────────────────────────────┐
│   ATTACH FIRST SUBSTRATE COMPONENT TO       │
│      SECOND SUBSTRATE COMPONENT             │
│                                         910 │
└─────────────────────────────────────────────┘
                      │
                      ▼
┌─────────────────────────────────────────────┐
│   ATTACH THIRD SUBSTRATE COMPONENT TO       │
│      SECOND SUBSTRATE COMPONENT             │
│                                         920 │
└─────────────────────────────────────────────┘
```

FIG. 9

PACKAGE SUBSTRATE Z-DISAGGREGATION WITH LIQUID METAL INTERCONNECTS

BACKGROUND

The die area of high-performance processors continues to scale upward, even with decreasing transistor sizes, as more performance is demanded in successive product generations. The number of build-up layers in the packaging substrate, which are used to route signals from an integrated circuit die to package input/output pins (pads or bumps), has increased with increasing die area and increasing die and package signal counts. This increase in the build-up layer count results in increased package costs and reduced yield due to a more complex substrate manufacturing process required to produce a substrate with more layers.

BRIEF DESCRIPTION OF THE DRAWINGS

FIG. 5A is a partial cross-sectional view of an unassembled substrate assembly.

FIG. 5B is a partial cross-sectional view of the substrate assembly of FIG. 5A as assembled.

FIGS. 8A-8F illustrate an example method of creating through holes comprising liquid metal and surface interconnects on a substrate component.

FIG. 9 is an example method of assembling a substrate assembly.

DETAILED DESCRIPTION

Figure 1:
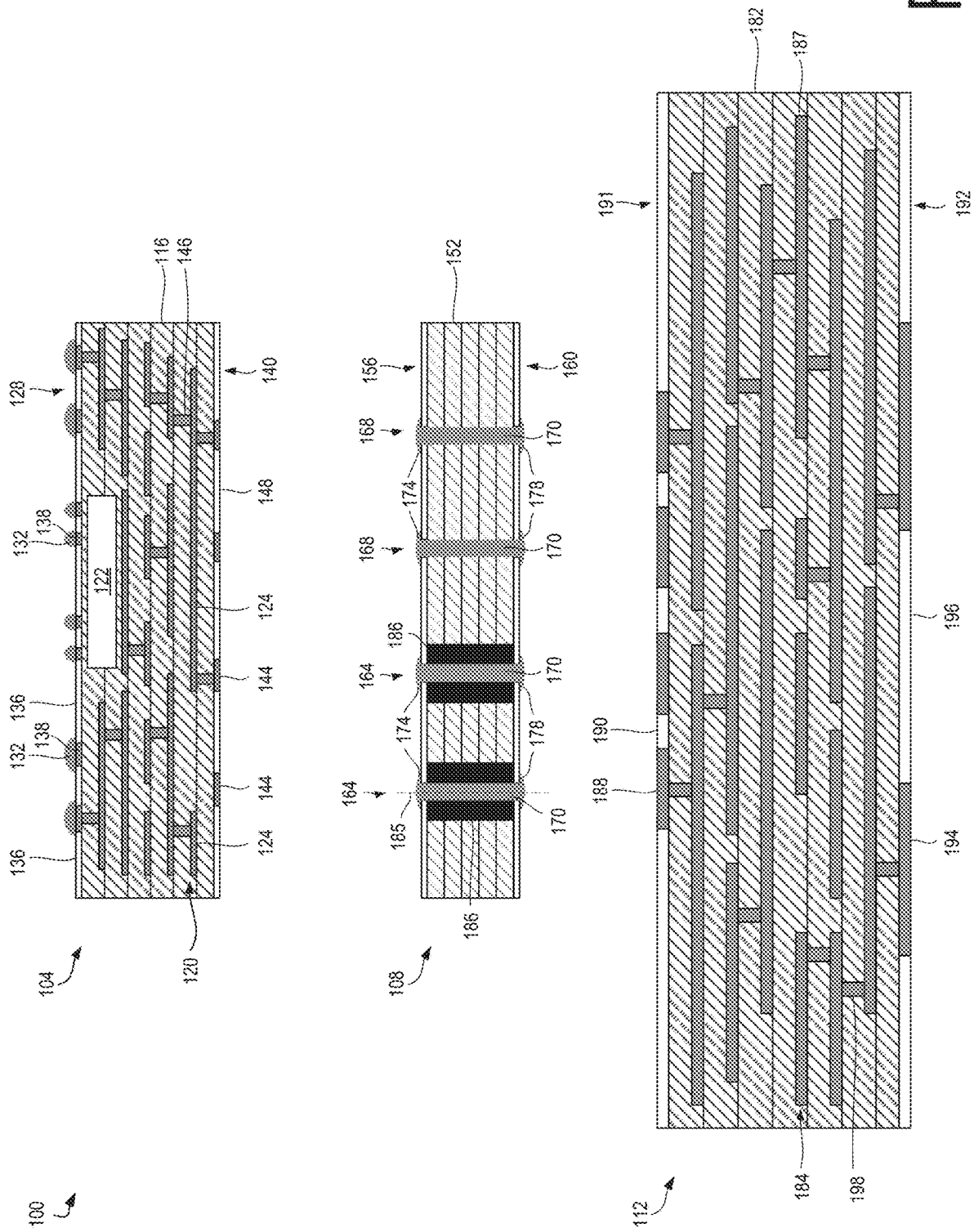
FIG. 1 is a cross-sectional view of an unassembled substrate assembly.

Processor die area has increased as will continue to increase as the performance of high-performance processors is pushed in successive product generations. Die area increases and increasing processor complexity result in an increase in the die and package signal count, the number of build-up layers in the package substrate, and the area consumed by the build-up layers, which in turn can result in increased package manufacturing complexity, yield loss, and cost.

Existing approaches to attempt to reduce build-up area, build-up layer count, and improve package substrate include X-Y disaggregation, reconstitution, and z-disaggregation. In some of these approaches, technologies that may be yield-limiting, such as the use of embedded bridges in the package substrate for routing signals between dies, are included in a substrate patch component that is separate from other substrate components.

Some existing z-disaggregation approaches involve the use of middle-layer interconnects, but these approaches can reduce signal performance. For example, in one existing z-disaggregation approach, Patch on Interposer (PoINT), the middle-layer interconnects are a point for electrical loss due to lossy ball grid array (BGA) interconnects. PoINT solutions suffer from additional disadvantages. As the patch in PoINT solutions typically have symmetric front-side and back-side layer counts, PoINT patches in which the backside layers are used for power signal routing result in wasting the high interconnect routing capability of the backside layers.

The technologies disclosed herein utilize liquid metal interconnects in a z-disaggregation approach to provide a substrate assembly for integrated circuit components. The disclosed substrate assemblies comprise a coreless patch with higher density interconnect routing that attaches to one or more integrated circuit dies, an interposer with lower density interconnect routing that provides the package input/output and power connections, and a core patch with liquid metal interconnections to connect the coreless patch to the interposer.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate, and an integrated circuit component attached to a printed circuit board that send signals to or receives signals from other integrated circuit components or electronic devices attached to the printed circuit board.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, the central axis of a magnetic plug that is substantially coaxially aligned with a through hole may be misaligned from a central axis of the through hole by several degrees. In another example, a substrate assembly feature, such as a through width, that is described as having substantially a listed dimension can vary within a few percent of the listed dimension.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

FIG. 1 is a cross-sectional view of an unassembled substrate assembly. The substrate assembly 100 comprises a first substrate component 104, a second substrate component 108, and a third substrate component 112. The first substrate component 104 can be referred to as a coreless patch and may be characterized by thinner dielectric and interconnect layers and higher density interconnect routing relative to the second and third substrate component 112, and comprising one or more embedded bridges to allow for communication between attached integrated circuit dies. The second substrate component 108 can be referred to as a core patch and may be characterized by thicker dielectric layers than those in the coreless patch and acts as a middle layer interconnect to connect first substrate component 104 to the third substrate component 112. The third substrate component 112 can be referred to as an interposer and may be characterized by thicker dielectric and interconnect layer and lower density interconnect routing relative to the first substrate component 104. When assembled, the substrate assembly 100 provides for the routing of signals from integrated circuit dies to the package exterior along with spatially translating those signals from the finer pitch of the integrated circuit die connections to the looser pitch of the package connections.

The first substrate component 104 comprises a printed circuit board (PCB) comprising dielectric layers 116 and interconnect layers 120. The individual interconnect layers 120 are disposed between adjacent dielectric layers 116 and comprise conductive traces 124. The first substrate component 104 is illustrated as having six dielectric layers 116 and five interconnect layers 120. The first substrate component 104 can be considered to be a substrate component with one-sided interconnect routing. Thus, the first substrate component 104 can be considered to be a "5-0-0" substrate component, with five front-side interconnect routing layers (the interconnect layers 120), zero core interconnect routing layers, and zero backside interconnect layers. A first face 128 of the first substrate component 104 comprises conductive contacts 138 separated by insulating material 136 and coupling component 132 attached to the conductive contacts 138. The conductive contacts 138 are attached to coupling components 132, which can be, for example LGA solder balls or solder bumps. A second face 140 that opposes the first substrate component 104 comprises conductive contacts 144 separated by insulating material 148. Vias 146 connect conductive traces 124 of adjacent interconnect layers 120 or conductive contacts 138 or 144 to conductive traces 124.

The first substrate component 104 is a coreless component in that the dielectric layers 116 and the interconnect layers 120 are not arranged about one or more "core" dielectric layers that can be thicker than the dielectric layers 116. In some embodiments, the dielectric layers 116 comprise Anijomoto build-up film.

Figure 2:
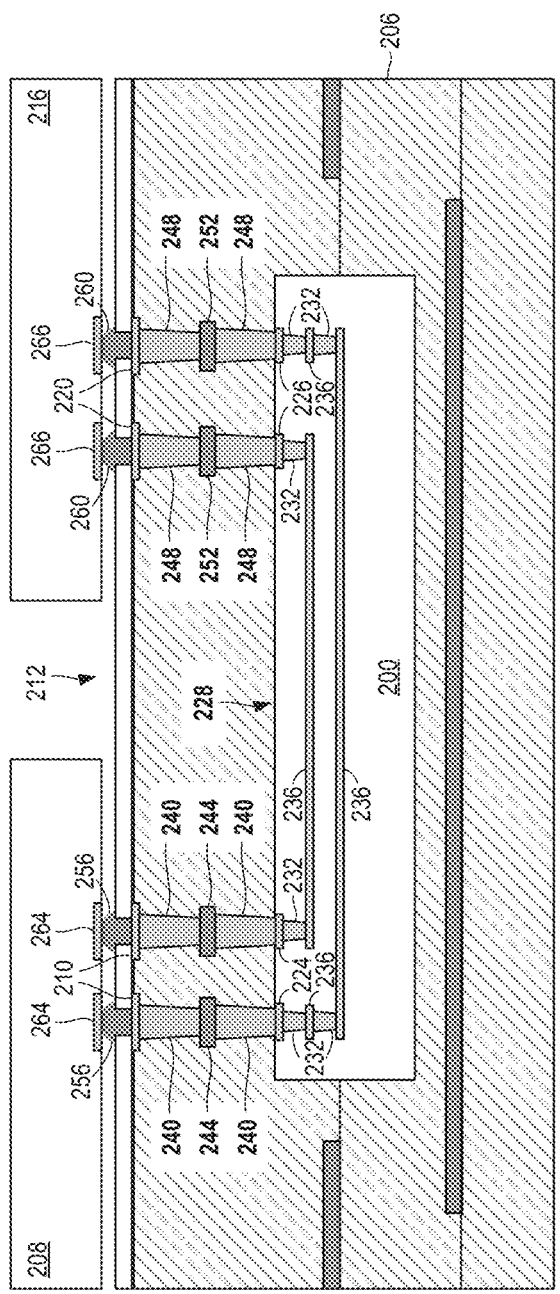
FIG. 2 is a cross-sectional view of an example bridge embedded within a first substrate component.

The first substrate component 104 further comprises an embedded bridge 122 that provides for communication between integrated circuit dies attached to the first face 128. FIG. 2 is a cross-sectional view of an example bridge (e.g., bridge 122) embedded within a first substrate component. The first substrate component 204 comprises dielectric layers 206. A first integrated circuit die 208 is attached to a face 212 of the substrate component 204 via coupling components 256 connecting to die conductive contacts 264 and substrate conductive contacts 210. A second integrated circuit die 216 is attached to the face 212 via coupling components 260 connecting to die conductive contacts 266 and substrate conductive contacts 220.

Bridge conductive contacts 224 and 226 are located on a face 228 of the bridge 200. Bridge vias 232 and bridge conductive traces 236 provide conductive pathways between the conductive contacts 224 and 226. Substrate vias 240 and substrate conductive traces 244 provide conductive pathways from the substrate conductive contacts 210 to the bridge conductive contacts 224 and substrate vias 248 and substrate conductive traces 252 provide conductive pathways from the substrate conductive contacts 220 to the bridge conductive contacts 226. Together, conductive contacts 210, 220, 224, 226, vias 232, 240, 248, and conductive traces, 236, 244, 252 provide conductive pathways between integrated circuit dies 208 and 216 and thus allow them to be communicatively coupled.

Although the embedded bridge 200 is shown as being fully embedded within the substrate component 204, in some embodiments, it can be partially embedded, with the bridge face 228 being part of the face 212 of the first substrate component 204. In such embodiments, the bridge conductive contacts 224 and 226 can be located at the face 212 of the substrate component 204 and the integrated circuit dies 208 and 212 can connect to the bridge conductive contacts 224 and 226 via coupling components 256 and 260, respectively.

Returning to FIG. 1, the second substrate component 108 comprises a printed circuit board comprising a first face 156, an opposing second face 160, and dielectric layers 152. Although there are no interconnect layers between the dielectric layers 152, in other embodiments, the second substrate component 108 can comprise an interconnect layer disposed between one or more pairs of adjacent dielectric layers 152, on the first face 156, and/or on the second face 160. The second substrate component 108 further comprises through holes 164 and 168 that extend through the second substrate component 108. The individual through holes 164 and 168 comprise a liquid metal plug 170. Coupling components 174 comprising liquid metal (liquid metal coupling components) are located at ends of the through holes 164 and 168 at the first face 156 and liquid metal coupling components 178 are located at the ends of the through holes 164 and 168 at the second face 160. A liquid metal coupling component can be an amount of liquid metal that has been placed at a desired location as the result liquid metal printing process.

In any of the embodiments described herein, a liquid metal interconnect is any interconnect of a substrate component that comprises a through hole comprising conductive material, a first coupling component located on a first face of the substrate component and disposed at a first end of the through hole, and a second coupling component located on a second face of the substrate component that opposes the first face and is disposed at a second end of the through hole that opposes the first end of the through hole, and wherein at least one of the through hole, the first coupling component, and the second coupling component comprise liquid metal.

The through holes 164 are surrounded by plugs 186 that comprise a magnetic material (magnetic plugs). In some embodiments, a magnetic plug 186 is substantially coaxially aligned with the through hole 164 that the magnetic plug 186 surrounds. That is, the magnetic plug and the through hole have substantially the same central axis (e.g., axis 185). The magnetic plugs 186 can act as embedded inductors that improve the quality of power signals (e.g., by reducing droop and/or ripple) that may be routed through the through holes 164 to an integrated circuit die or a voltage regulator integrated on an integrated circuit die (e.g., a fully integrated voltage regulator (FIVR)). The through holes 168 do not have a magnetic plug surrounding them. In some embodiments, non-power signals are routed through the through holes that are not surrounded by magnetic plugs (e.g., through holes 168) and power signals can be routed through the through holes that are surrounded by magnetic plugs (e.g., through holes 164). The magnetic plugs 186 can comprise magnetic paste (such as Anijomoto magnetic paste), a manganese ferrite, a manganese/zinc ferrite, or other suitable magnetic material.

Although the second substrate component 108 is illustrated as comprising five dielectric layers 152, in other embodiments, the second substrate component 108 can have fewer (and as few as just one dielectric layer) or more dielectric layers. Further, as will be discussed in greater detail below, an interconnect layer with conductive traces can be located on the face 156 and/or the face 160 to allow for the routing of signals on either or both faces of the second substrate component 108. In embodiments with interconnect routing on the first and second faces 156 and 160, the second substrate component 108 can be considered a "0-2-0" substrate component with zero frontside layers, two core layers, and zero backside layers.

The second substrate component 108 can be referred to as a core patch as the dielectric layers 152 are thicker than the dielectric layers 116 in the first substrate component. In some embodiments, the dielectric layers 152 may be formed of an epoxy resin, a fiberglass-reinforced epoxy resin, an epoxy resin with inorganic fillers, a ceramic material, or a polymer material such as polyimide.

The plugs 170 and the coupling components 174 and 178 can comprise any suitable liquid metal that is liquid at normal operating temperatures of a substrate assembly. In some embodiments, the liquid metal comprises gallium or an alloy of gallium, such as, for example, alloys of gallium and indium, eutectic alloys of gallium, indium, and tin, and eutectic alloys of gallium, indium, and zinc. The liquid metals used in the plugs 170 and the coupling components 174 and 178 can be flexible and stretchable. As such, they can accommodate manufacturing variations, which can lead to yield improvements and improved mechanical robustness. For example, liquid metal coupling components 174 and 178 can accommodate flex or warpage in a packaged integrated circuit component or differences in flex or warpage between substrate assembly components.

In some embodiments, the second substrate component 108 can be a silicon interposer in which through silicon vias (TSVs) are used to route signals through the component. In such embodiments, liquid metal coupling components can be disposed at ends of the TSVs.

The third substrate component 112 comprises a printed circuit board (PCB) comprising dielectric layers 182 and interconnect layers 184. The individual interconnect layers 184 are disposed between adjacent dielectric layers and comprise one or more conductive traces 187. The third substrate component 112 is illustrated as having seven dielectric layers 182 and six interconnect layers 184, but the third substrate component 112 can have more or fewer dielectric or interconnect layers in other embodiments. In some embodiments, the third substrate component 112 comprises 12 interconnect layers. A first face 191 of the third substrate component 112 comprises conductive contacts 188 separated by an insulating material 190. A second face 192 of the third substrate component 112 comprises conductive contacts 194 separated by insulating material 196. Vias 198 connect conductive traces 187 belonging to adjacent interconnect layers 184 or conductive contacts 188 or 194 to conductive traces 187. The conductive contacts 194 can be LGA (land grid array) pads to which socket pins can connect to when an integrated circuit component comprises the substrate assembly is inserted into a socket. In other embodiments, the conductive contacts 194 can be attached to coupling components such as solder balls or solder bumps for direct attachment of an integrated circuit component comprising the substrate assembly 100 to a printed circuit board (e.g., motherboard, system board, mainboard, interposer) In some embodiments, the third substrate component 112 is a stacked via laminate core (SVLC).

The insulating materials 136, 148, 190, and 196 can comprise solder resist or another insulating material. The coupling components 132 and 256 can be any coupling component described herein such as, for example, solder balls or solder bumps. The conductive contacts 138, 144, 188, and 194 can be any conductive contact described herein, such as, for example, a bond pad.

The substrate assembly 100 provides advantages over patch on interposer (PoINT) package substrate embodiments. The patch component of a PoINT solution comprises a core middle portion with build-up layers on either side. As the build-up layers on the patch component that are further away from the integrated circuit dies are typically used for routing power signals, the high-density routing benefit that these build-up layers can provide may be wasted. In contrast, the first and second substrate components 104 and 108, considered together, comprise high density interconnect routing capabilities on only one side of a core middle portion—the coreless patch 104. This results in the first and second substrate components collectively having fewer layers relative to a PoINT patch, which can translate into a lower overall z-height for the substrate assembly 100 relative to a PoINT substrate embodiment. Further, the use of liquid metal interconnects to connect the substrate components provides for a less lossy electrical connection than the ball grid array (BGA) solder balls used in PoINT embodiments. Moreover, liquid metal interconnects are more readily separable than other types of interconnects. This allows for the improved risk management of low-yielding components in a substrate assembly by easily swapping out a defective substrate component with a different one without having to apply additional heat (e.g., using a reflow oven) to enable the detachment. Furthermore, relegating the use of embedded bridges, which can have a negative impact on yield, to the coreless patch improves the overall yield of the substrate assembly as a good core patch and a good interposer can be reused with a different coreless patch in a coreless patch is found to be defective.

Figure 3:
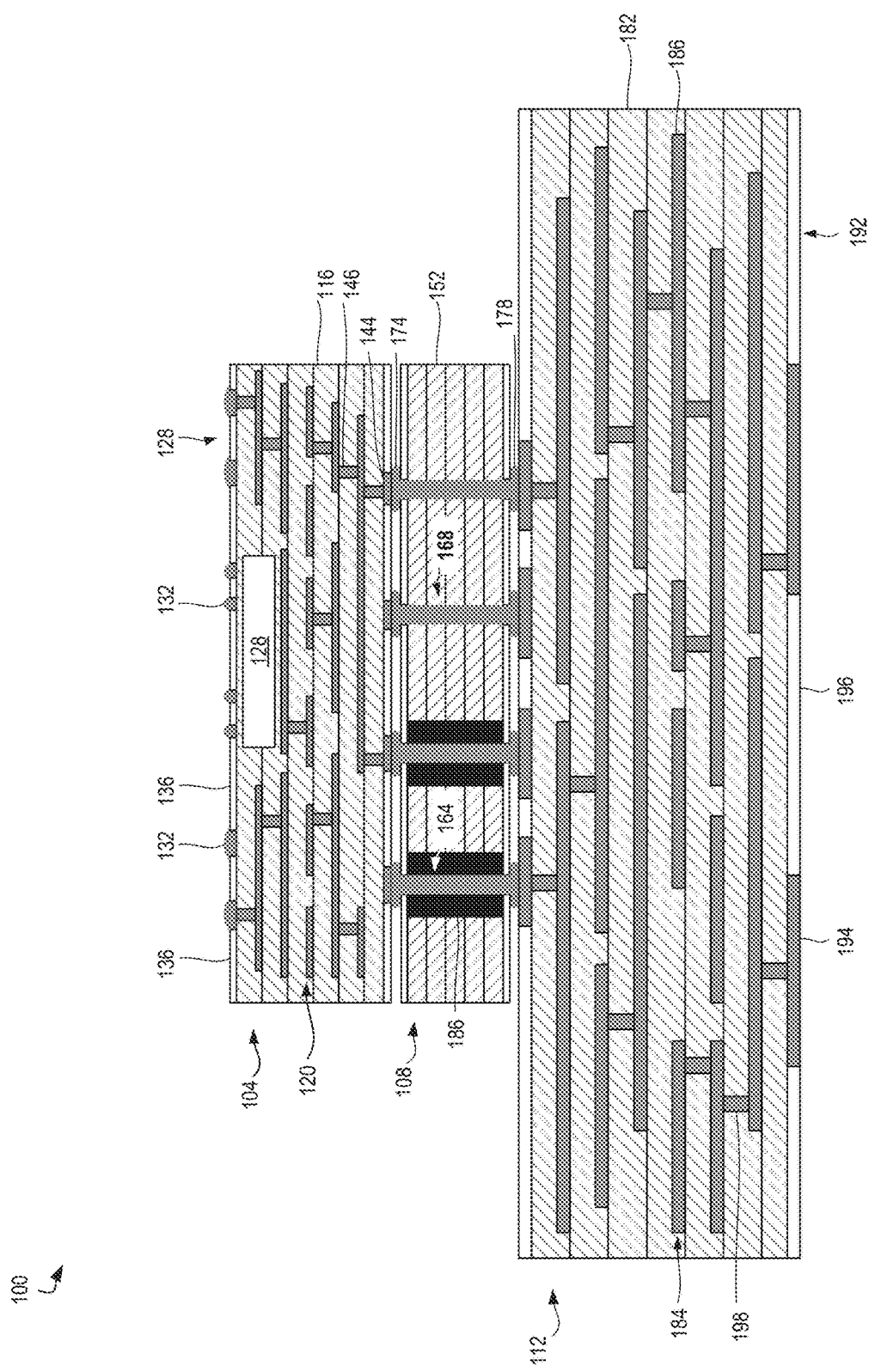
FIG. 3 is a cross-sectional view of the substrate assembly of FIG. 1 as assembled.

FIG. 3 is a cross-sectional view of the substrate assembly of FIG. 1 as assembled. The first substrate component 104 is attached to the second substrate component 108 via the liquid metal coupling component 174 and the third substrate component 112 is attached to the second substrate component 108 via the liquid metal coupling component 178. The assembled substrate assembly 100 can be considered a "5-0-6" substrate, with six frontside interconnect layers (the six internal interconnect routing layers of the third substrate component 112), zero core interconnect routing layers (interconnect layers 184), and five backside interconnect routing layers (interconnect layers 120).

Figure 4A:
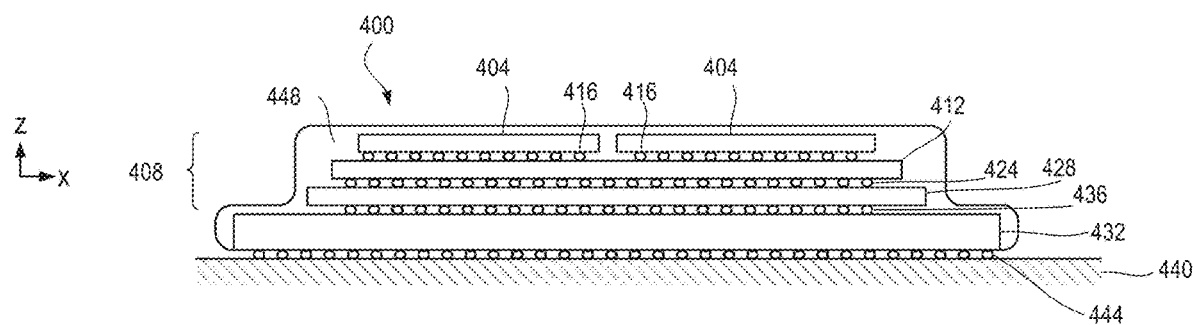
FIG. 4A is a cross-sectional view of an example integrated circuit component comprising a substrate assembly.

FIG. 4A is a cross-sectional view of an example integrated circuit component comprising a substrate assembly. The integrated circuit component 400 comprises multiple integrated circuit dies 404 attached to a substrate assembly 408 via first coupling components 416 (e.g., BGA solder balls, solder bumps). The first coupling components 416 can attach to die conductive contacts (e.g., pads, bumps), which are not shown, located on the integrated circuit dies 404. The substrate assembly 408 comprises a first substrate component 412 (e.g., first substrate component 104) attached to the integrated circuit dies 404 via the first coupling components 416. The first substrate component 412 is attached to a second substrate component 428 via second coupling components 424 and the second substrate component 428 is in turn attached to a third substrate component 432 via third coupling components 436. The integrated circuit component 400 is attached to a printed circuit board 440 via fourth coupling components 444. The integrated circuit component 400 comprises an encapsulant 448 that encapsulates the integrated circuit dies 404 and the substrate assembly 408. The encapsulant 448 can comprise metal, ceramic, plastic, or a combination thereof.

The integrated circuit component 400 can be communicatively coupled to one or more other components attached to the printed circuit board 440, such as another integrated circuit component (e.g., a memory, a processor unit, network interface controller, I/O controller) or any other processing device component (e.g., battery, antenna). The integrated circuit component 400 and the printed circuit board 440 can be located in a housing of an electronic device.

Figure 4B:
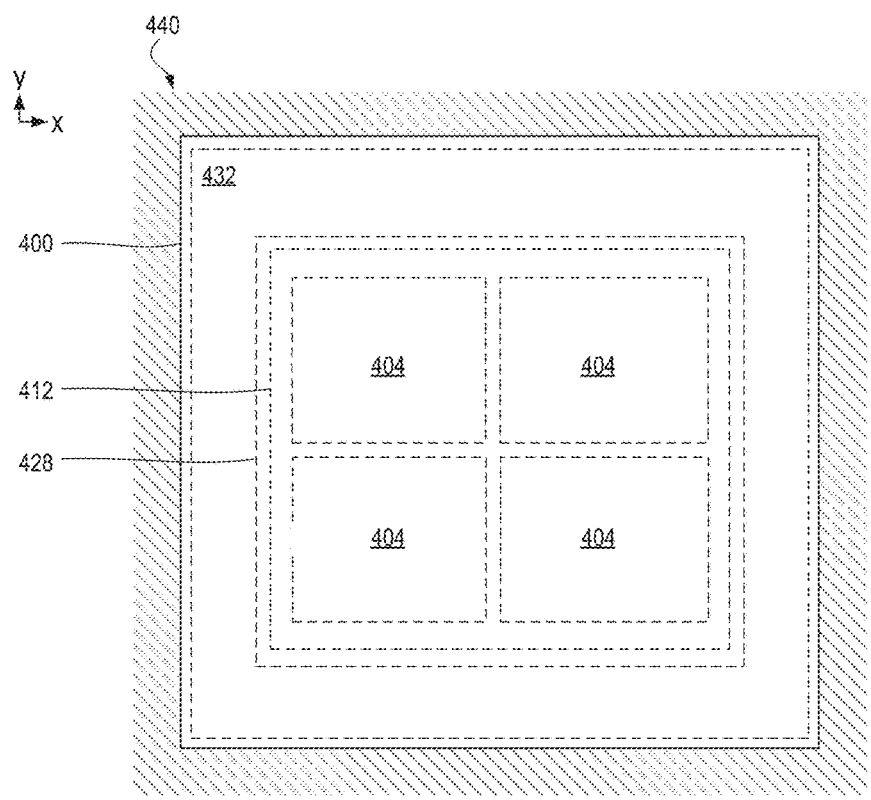
FIG. 4B is a top view of the integrated circuit component of FIG. 4A.

FIG. 4B is a top view of the integrated circuit component of FIG. 4A. The integrated circuit component 400 comprises four integrated circuit dies 404. By having separate substrate components with higher density interconnect routing (e.g., first substrate component 412) and lower density interconnect routing (e.g., third substrate component 432), the x-y area of the component providing the higher density interconnect routing can be less than that of the component providing the lower density interconnect routing. FIG. 4B shows that the x-y area of the first substrate component 412 is less than that of the third substrate component 432. The second substrate component 428 is illustrated in FIGS. 4A and 4B as having an x-y area slightly larger than that of the first substrate component 412, but in other embodiments the x-y area of the component 428 can be greater or lesser than shown. In general, the x-y area of the second substrate component 428 can be any area greater than or equal to that of the first substrate component 412 and less than or equal to that of the third substrate component 432.

In some embodiments, the integrated circuit dies 404 comprise different types of integrated circuit die (e.g., high-performance processor unit, high-efficiency (low-power) processor unit, memory). An integrated circuit component 400 comprising integrated circuit dies 404 of different types can be referred to as a heterogeneous integrated circuit component.

FIGS. 5A & 5B illustrate a substrate assembly comprising protrusions. FIG. 5A is a partial cross-sectional view of an unassembled substrate assembly. The substrate assembly 500 is similar to the substrate assembly 100 illustrated in FIG. 1 and comprises a first substrate component 504, a second substrate component 508, and a third substrate component 512. The first and third components 504 and 512 are partially shown. The individual conductive contacts 544 of the first substrate component 504 comprise a protrusion 590 that extends from a face 540 of the component 504. Conductive contacts 588 located on a face 586 of the third component 512 comprise similar protrusions 594. The protrusions 590 and 594 may aid in improving the mechanical strength, reliability and/or the electrical performance of connections between the second components 508 and the first and third substrate components 504 and 512. In some embodiments, the protrusions 590 and 596 can comprise metal, such as copper. The protrusions 590 and 594 can comprise other metals or other conductive materials in other embodiments.

The protrusions 590 and 594 can further aid connectivity between substrate components as the stretchability of the liquid metal coupling component can make connections between components self-aligning connections. Once a protrusion 590 or 594 has contacted a liquid metal coupling component, the liquid metal may stretch to keep the interconnect in physical and electrical contact with the protrusion if the protrusion undergoes lateral displacement.

FIG. 5B is a partial cross-sectional view of the substrate assembly of FIG. 5A as assembled. The protrusions 590 extend into the liquid metal coupling component 574 and the protrusions 594 extend into the liquid metal coupling component 578. The protrusions 590 and 594 are illustrated as having a pillar form factor but can have different shape or aspect ratio in other embodiments. In some embodiments, the protrusion 590 and 594 can have a pad shape. In embodiments where the protrusions 590 comprise pillars, the pillars can comprise a solder cap.

Figure 6A:
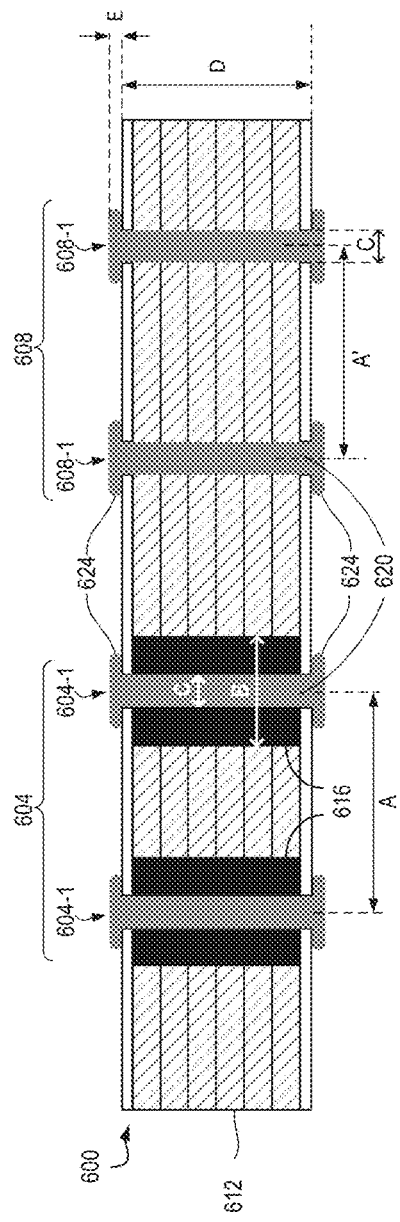
FIGS. 6A-6C are cross-sectional views of example through hole variations that can be used in a substrate component.
Figure 6B:
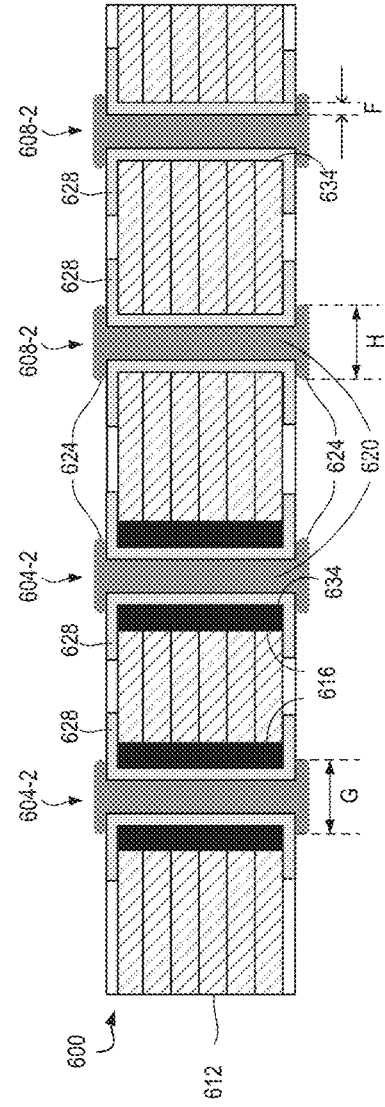
Figure 6C:
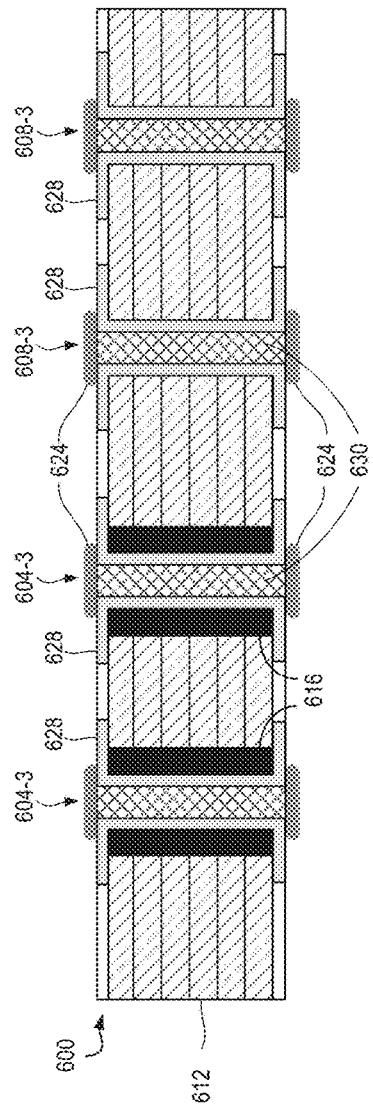

FIGS. 6A-6C are cross-sectional views of example through hole variations that can be used in a second substrate component (e.g., core patch). The through holes 604 and 608 extend through dielectric layers 612 of a core patch 600 with through holes 604 surrounded by and substantially coaxially aligned with magnetic plugs 616 (coaxial through holes) and through holes 608 not surrounded by magnetic plugs. FIG. 6A illustrates an example core patch 600 comprising through holes comprising liquid metal and liquid metal coupling components. The core patch 600 comprises through holes 604-1 and 608-1 that comprise plugs 620 comprising liquid metal. The through holes 604-1 and 608-1 are attached to liquid metal coupling component 624. As such, the through holes 604-1 and 608-1 in FIG. 6A are similar to the through holes 164 and 168, respectively, illustrated in FIG. 1.

In some embodiments, the through hole-to-through hole spacing for through holes surrounded by a magnetic plug (dimension A), is in the range of 10-100 um. In some embodiments, dimension A can be substantially 450 um or 550 um. In some embodiments, the through hole-to-through hole spacing for through holes not surrounded by a magnetic plug (dimension A') can be substantially 325 um or 332.5 um. In some embodiments, the width (e.g., drill diameter) of a through hole comprising a magnetic plug (dimension B) is in the range of 100-600 um. In some embodiments, dimension B can be substantially 350 um or 450 um. In some embodiments, the width (e.g., drill diameter) of the through hole plugs comprising liquid metal (dimension C), is in the range of 100-600 um. In some embodiments, dimension C can be substantially 0.15 um. In some embodiments, the height of a through hole plug (dimension D), is in the range of 100-1200 um. In some embodiments, the distance that a coupling component comprising liquid metal protrudes from a face of a substrate component (dimension E) is in the range of 5-200 um. In some embodiments, the width of a coupling component comprising liquid metal disposed at an end of a through hole surrounding a magnetic plug (dimension G) can be substantially 295 um, 320 um, or 350 um. In some embodiments, the width of a coupling component comprising liquid metal disposed at an end of a through hole that is not surrounded by a magnetic plug (dimension H) can be substantially 265 um.

FIG. 6B illustrates an example core patch 600 comprising plated through holes comprising liquid metal and coupling components comprising liquid metal. In the embodiment of FIG. 6B, the core patch 600 comprises through holes 604-2 and 608-2 comprising plugs 620 that comprising liquid metal. Coupling components 624 comprising liquid metal are located at the ends of the through holes 604-2 and 608-2. A wall 634 of the through holes 604-2 and 608-2 are plated with a layer 628 comprising a conductive material. In some embodiments, the layer 628 comprises copper, although in other embodiments other suitable conductive materials may be used. In some embodiments, the thickness of the layer 628 along the walls of the through holes (dimension F) is in the range of 5-50 um.

FIG. 6C illustrates an example core patch 600 comprising plated through holes and coupling components comprising liquid metal. In the embodiment of FIG. 6C, the core patch 600 comprises through holes 604-3 and 608-3 with plugs 630 comprising a non-liquid metal conductive material (e.g., copper) and coupling components 624 comprising liquid metal disposed at the ends of through holes 604-3 and 608-3.

In some embodiments, the through holes 604-1, 604-2, 608-1 and 608-2 are not completely filled by the plugs 620. That is, these through holes may be partially filled by the plugs 620 and 630. In some embodiments, the plugs 620 and 630 can contain voids. In some embodiments, the plugs 620 can comprise one or more materials other than liquid metal (e.g., copper or another conductive material). In these embodiments, the plugs 620 can comprise a mixture of liquid metal and non-liquid metal materials or a combination of one or more regions of liquid metal and one or more regions of non-liquid metal materials.

Although the substrate components 600 in FIGS. 6A-6C are shown with coupling components comprising liquid metal on both faces, in other embodiments, the coupling components on only one face of the substrate component can comprise liquid metal and the coupling components on the other side can comprise a different conductive material, such as copper.

Figure 7A:
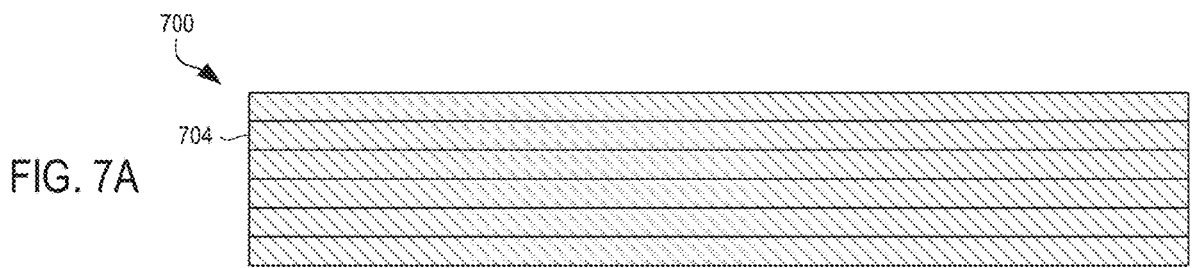
FIGS. 7A-7E illustrate an example method of creating through holes comprising liquid metal in a substrate component.
Figure 7B:
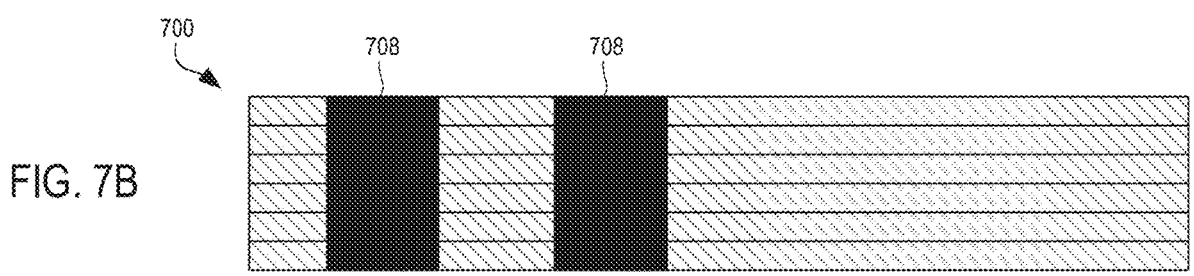
Figure 7C:
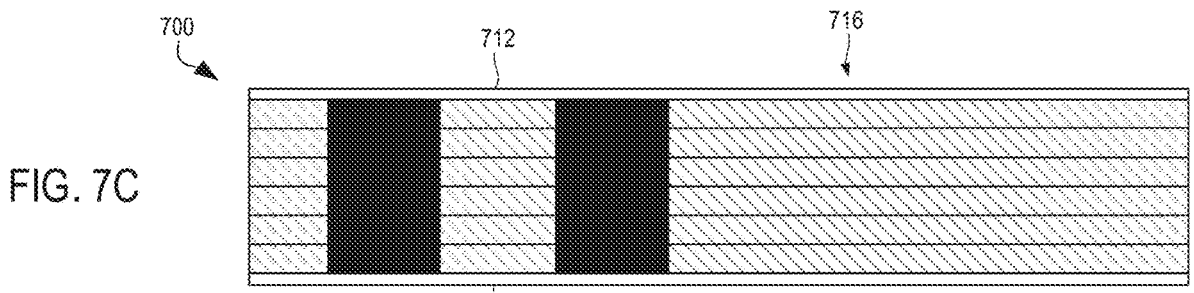

FIGS. 7A-7E illustrate an example method of creating through holes comprising liquid metal in a core patch. FIG. 7A illustrates a substrate component 700 (e.g., second substrate component 108, 508, 600) in which through holes are to be formed. The substrate component 700 is a circuit board comprising dielectric layers 704. FIG. 7B illustrates the creation of plugs 708 comprising magnetic material in the substrate component 700. The magnetic plugs 708 are created by drilling a hole through the substrate component 700, filling the hole with magnetic material, removing the excess magnetic material and curing the substrate component after the hole has been filled. In some embodiments, removing the excess magnetic material can comprise grinding away the excess magnetic material. The magnetic material can comprise magnetic paste (such as Anijomoto magnetic paste), a manganese ferrite, a manganese/zinc ferrite, or other suitable magnetic material. FIG. 7C illustrates the addition of a die attach film 712 to a first face 716 and an opposing second face 720 of the substrate component 700.

Figure 7D:
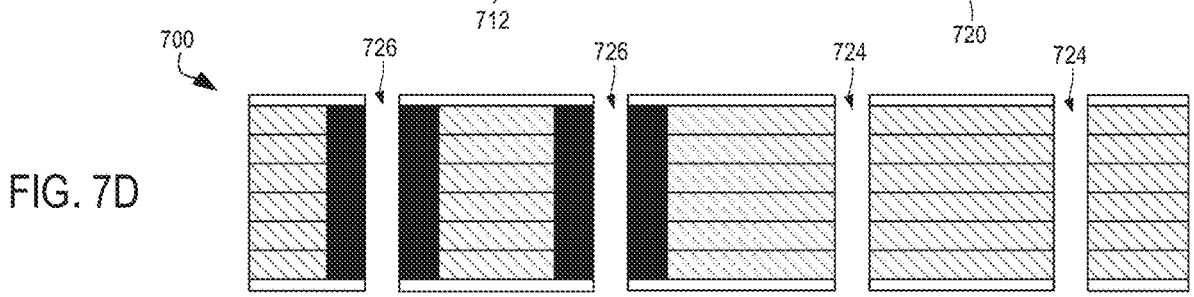
Figure 7E:
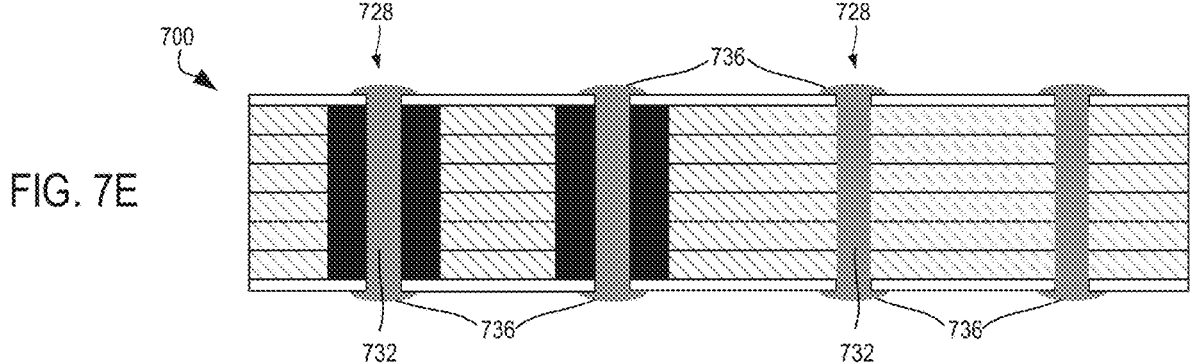

FIG. 7D illustrates the creation of holes 724 in the substrate component 700 in which interconnect plugs will be created. The holes 724 are created by drilling through the dielectric layers 704 of the substrate component 700 and the holes 726 are created by drilling through the magnetic plugs 708. The holes 724 and 726 can have the same or different widths. In some embodiments, creation of the holes 726 can comprise the use of a high-pressure water jet as a rinse process instead of a desmear process to remove debris from the holes 726. FIG. 7E illustrates the creation of through holes 728 comprising liquid metal and the creation of coupling components 736 comprising liquid metal. Creation of the through holes 728 comprises creating plugs 732 comprising liquid metal in the holes 724 and 726. Creation of the coupling components 736 comprises printing liquid metal features on the first face 716 and the second face 720 of the core patch. The printing of liquid metal features on the faces of a substrate component can comprise existing approaches for printing liquid metal features, such as disclosed in U.S. Pat. No. 9,835,648 (issued Dec. 5, 2017).

FIGS. 8A-8F illustrate an example method of creating through holes comprising liquid metal and surface interconnects on a core patch. FIGS. 8A-8B illustrate the creation of magnetic plug 808 in a substrate component 800 (e.g., second substrate component 108, 508, 600), which is a circuit board comprising dielectric layers 804. The creation of the magnetic plugs can be performed as discussed above in relation to FIGS. 7A-7B. FIG. 8C illustrates the addition of conductive layers 822 to a first face 816 and an opposing second face 820 of the substrate component. The conductive layers 822 can comprise copper or other suitable conductive materials. FIG. 8D illustrates the creation of conductive trace features 826 on the first and second faces 816 and 820. The conductive trace features 826 can be created by a photolithographic process in which a pattern is transferred from a mask and regions of the conductive layers 822 not protected by the mask are selectively removed, for example, via a chemical etch. FIG. 8E illustrates the addition of a die attach film 812 to the first face 816 and an opposing second face 820.

FIG. 8F illustrates the creation of through holes 828 comprising liquid metal and coupling components 836 comprising liquid metal. The through holes 830 are created by drilling through the dielectric layers 804 of the substrate component 800 to create holes that extend through the core patch, and creating plugs 832 comprising liquid metal in the holes. The through holes 828 are created by drilling through the magnetic material plugs 808 of the substrate component 800 to create holes that extend through the core patch, and creating plugs 832 comprising liquid metal in the holes. In some embodiments, creation of the holes can comprise the use of a high-pressure water jet as a rinse to remove debris from the holes. The creation of the coupling components 836 comprises printing liquid metal features on the first face 816 and the second face 820 of the core patch, which can be performed using existing methods, as described above. The conductive trace features 826 can allow for the routing of signals on either face of the substrate component and/or to electrically connect multiple coupling components. Although not shown in the figures, coupling components comprising liquid metal can have one or more layers comprising conductive materials between the coupling component and a through hole plug comprising liquid metal, such as a layer of copper or other suitable conductive material.

FIG. 9 is an example method of assembling a substrate assembly. The method 900 can be performed by, for example, an integrated circuit component vendor. At 910, a first substrate component is attached to a second substrate component. At 920, a third substrate component is attached to the second substrate component. The first substrate component comprises: a plurality of first conductive contacts located on a face of the first substrate component; one or more first interconnect layers comprising conductive traces; one or more first dielectric layers, individual of the first interconnect layers disposed between adjacent first dielectric layers. The second substrate component comprises: one or more second dielectric layers; a plurality of first coupling components comprising liquid metal; a plurality of second coupling components comprising liquid metal; and a plurality of through holes extending through the second dielectric layers, individual of through holes having a first coupling component disposed at a first end of the individual through hole and a second coupling component disposed at a second end of the through hole that opposes the first end of the individual through hole. The third substrate component comprises: a plurality of second conductive contacts located on a face of the third substrate component; one or more second interconnect layers comprising conductive traces; and one or more third dielectric layers, individual of the second interconnect layers disposed between adjacent the third dielectric layers. The plurality of the first coupling components connect to the plurality of the first conductive contacts. The plurality of the second coupling components connect to the plurality of the second conductive contacts. The second substrate component is disposed between the first substrate component and the third substrate component.

The method 900 can comprise additional elements in other embodiments. For example, the method 900 can further comprise detaching the first substrate component from the second substrate component without the application of heat to enable the detaching; and attaching a different first substrate component to the second substrate component to replace the first substrate component. In another example, the method 900 can further comprise detaching the third substrate component from the first substrate component without the application of heat to enable the detaching; and attaching a different third substrate component to the second substrate component to replace the first substrate component.

Figure 10:
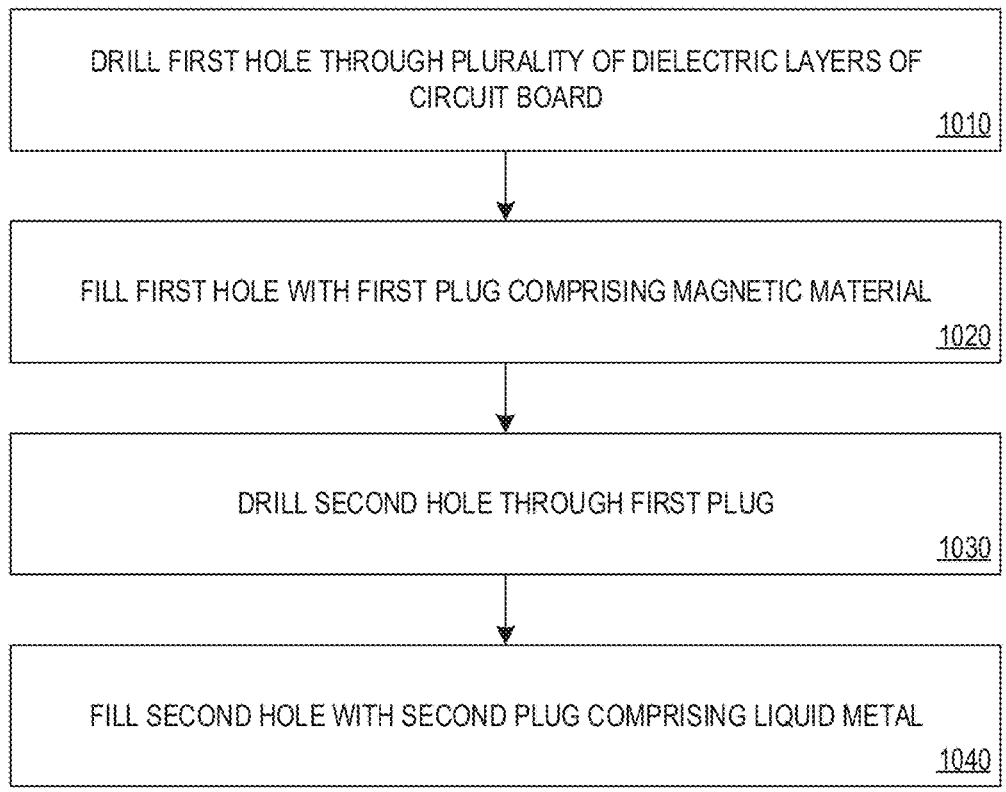
FIG. 10 is an example method of creating a core patch.

FIG. 10 is an example method of creating a core patch. The method 1000 can be performed by an integrated circuit vendor. At 1010, a first hole is drilled through a circuit board comprising a plurality of dielectric layers, the first hole extending through the plurality of dielectric layers. At 1020, the first hole is filled with a first plug comprising magnetic material. At 1030, a second hole is drilled through the first plug. At 1040, the second hole is filled with a second plug comprising liquid metal, the second plug surrounded by and substantially coaxially aligned with the first plug.

The method 1000 can comprise additional elements in other embodiments. For example, the method 1000 can further comprise printing a coupling component comprising liquid metal on the first face of the circuit board, the coupling component disposed at an end of the second plug. In another example, the method 1000 can further comprise plating a wall of the first hole with a layer comprising copper.

Figure 11:
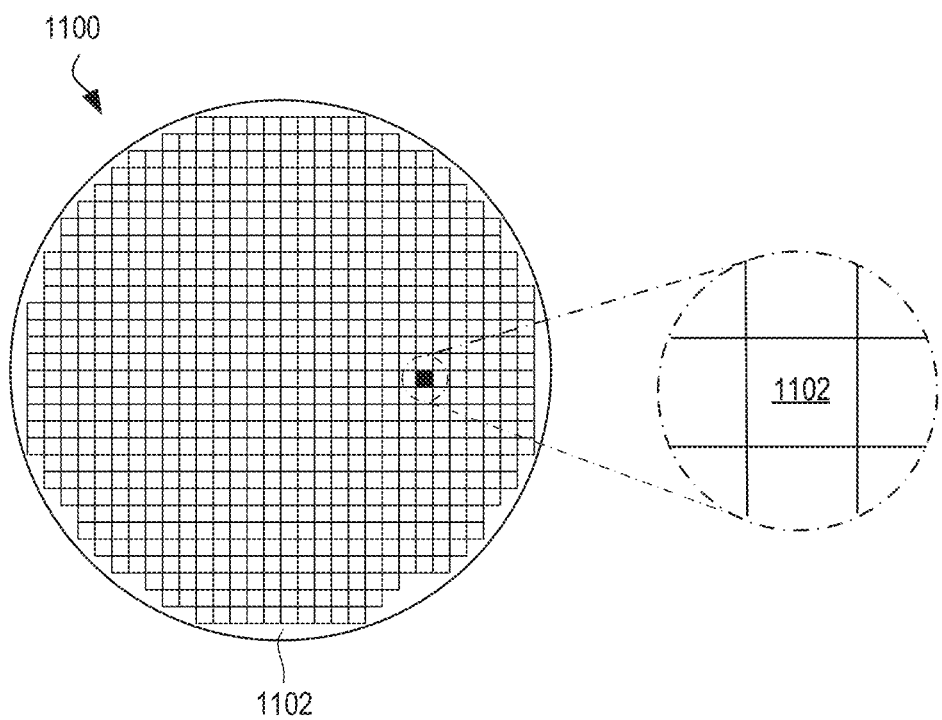
FIG. 11 is a top view of a wafer and dies that may be included in a substrate assembly, in accordance with any of the embodiments disclosed herein.

FIG. 11 is a top view of a wafer 1100 and dies 1102 that may be included in any of the substrate assemblies disclosed herein (e.g., as any one of substrate components comprising a substrate assembly) or an integrated circuit die attached to a substrate assembly. The wafer 1100 may be composed of semiconductor material and may include one or more dies 1102 having integrated circuit structures formed on a surface of the wafer 1100. The individual dies 1102 may be a repeating unit of an integrated circuit product that includes any suitable integrated circuit. After the fabrication of the semiconductor product is complete, the wafer 1100 may undergo a singulation process in which the dies 1102 are separated from one another to provide discrete "chips" of the integrated circuit product. The die 1102 may be any of the integrated circuit dies. The die 1102 may include one or more transistors (e.g., some of the transistors 1240 of FIG. 12, discussed below), supporting circuitry to route electrical signals to the transistors, passive components (e.g., signal traces, resistors, capacitors, or inductors), and/or any other integrated circuit components. In some embodiments, the wafer 1100 or the die 1102 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), a substrate core patch (e.g., second substrate component 108) or any other suitable circuit element. Multiple ones of these devices may be combined on a single die 1102. For example, a memory array formed by multiple memory devices may be formed on a same die 1102 as a processor unit (e.g., the processor unit 1402 of FIG. 14) or other logic that is configured to store information in the memory devices or execute instructions stored in the memory array. Various ones of the integrated circuit components disclosed herein may be manufactured using a die-to-wafer assembly technique in which some integrated circuit dies located within the integrated circuit components are attached to a wafer 1100 that include others of the integrated circuit dies, and the wafer 1100 is subsequently singulated.

Figure 12:
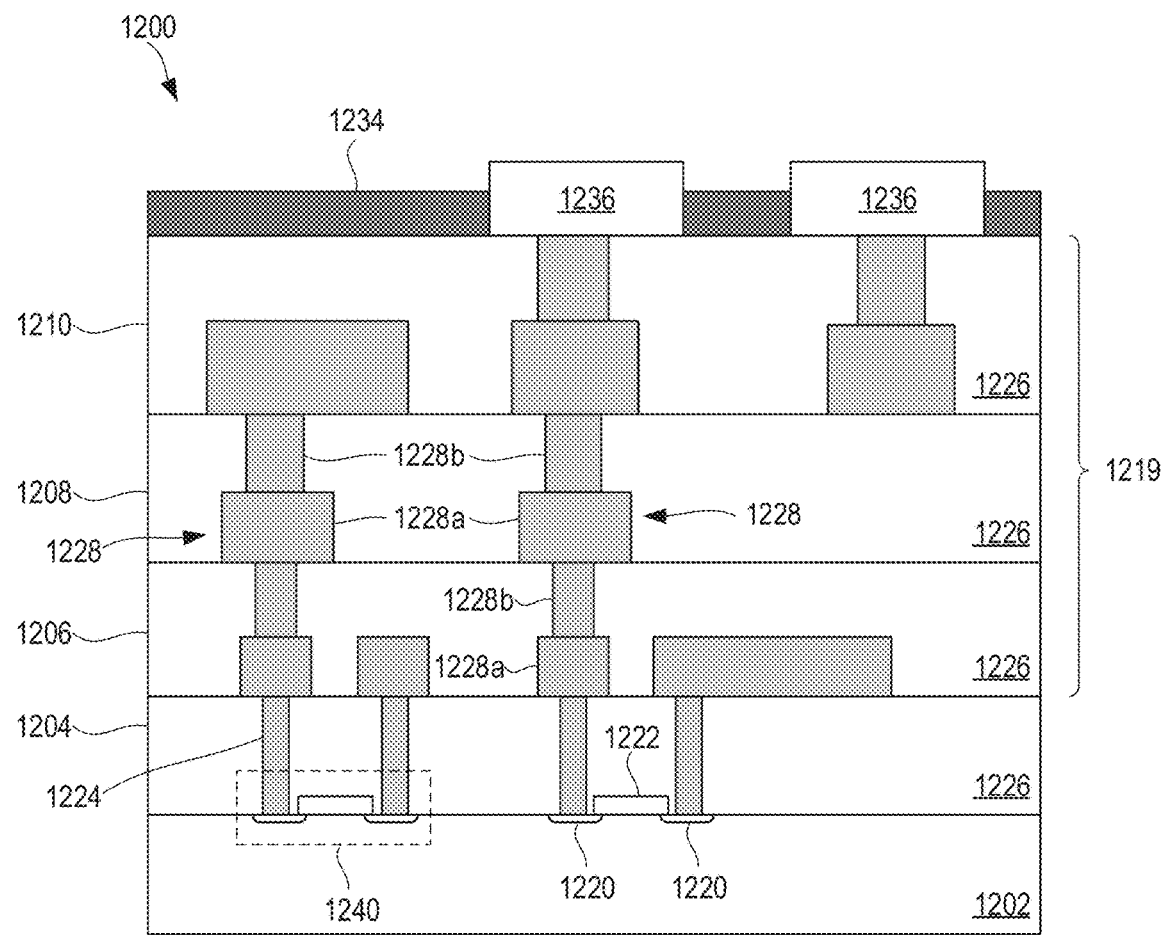
FIG. 12 is a cross-sectional side view of an integrated circuit device that may be included in a substrate assembly, in accordance with any of the embodiments disclosed herein.

FIG. 12 is a cross-sectional side view of an integrated circuit device 1200 that may be included in or attached to any of the substrate assemblies disclosed herein. One or more of the integrated circuit devices 1200 may be included in one or more dies 1102 (FIG. 11). The integrated circuit device 1200 may be formed on a die substrate 1202 (e.g., the wafer 1100 of FIG. 11) and may be included in a die (e.g., the die 1102 of FIG. 11). The die substrate 1202 may be a semiconductor substrate composed of semiconductor material systems including, for example, n-type or p-type materials systems (or a combination of both). The die substrate 1202 may include, for example, a crystalline substrate formed using a bulk silicon or a silicon-on-insulator (SOI) substructure. In some embodiments, the die substrate 1202 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1202. Although a few examples of materials from which the die substrate 1202 may be formed are described here, any material that may serve as a foundation for an integrated circuit device 1200 may be used. The die substrate 1202 may be part of a singulated die (e.g., the dies 1102 of FIG. 11) or a wafer (e.g., the wafer 1100 of FIG. 11).

The integrated circuit device 1200 may include one or more device layers 1204 disposed on the die substrate 1202. The device layer 1204 may include features of one or more transistors 1240 (e.g., metal oxide semiconductor field-effect transistors (MOSFETs)) formed on the die substrate 1202. The transistors 1240 may include, for example, one or more source and/or drain (S/D) regions 1220, a gate 1222 to control current flow between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 12 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Individual transistors 1240 may include a gate 1222 formed of at least two layers, a gate dielectric, and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1240 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1240 along the source-channel-drain direction, the gate electrode may consist of a U-shaped structure that includes a bottom portion substantially parallel to the surface of the die substrate 1202 and two sidewall portions that are substantially perpendicular to the top surface of the die substrate 1202. In other embodiments, at least one of the metal layers that form the gate electrode may simply be a planar layer that is substantially parallel to the top surface of the die substrate 1202 and does not include sidewall portions substantially perpendicular to the top surface of the die substrate 1202. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1220 may be formed within the die substrate 1202 adjacent to the gate 1222 of individual transistors 1240. The S/D regions 1220 may be formed using an implantation/diffusion process or an etching/deposition process, for example. In the former process, dopants such as boron, aluminum, antimony, phosphorous, or arsenic may be ion-implanted into the die substrate 1202 to form the S/D regions 1220. An annealing process that activates the dopants and causes them to diffuse farther into the die substrate 1202 may follow the ion-implantation process. In the latter process, the die substrate 1202 may first be etched to form recesses at the locations of the S/D regions 1220. An epitaxial deposition process may then be carried out to fill the recesses with material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220.

Electrical signals, such as power and/or input/output (I/O) signals, may be routed to and/or from the devices (e.g., transistors 1240) of the device layer 1204 through one or more interconnect layers disposed on the device layer 1204 (illustrated in FIG. 12 as interconnect layers 1206-4210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1210 may form a metallization stack (also referred to as an "ILD stack") 1219 of the integrated circuit device 1200.

The interconnect structures 1228 may be arranged within the interconnect layers 1206-1210 to route electrical signals according to a wide variety of designs; in particular, the arrangement is not limited to the particular configuration of interconnect structures 1228 depicted in FIG. 12. Although a particular number of interconnect layers 1206-1210 is depicted in FIG. 12, embodiments of the present disclosure include integrated circuit devices having more or fewer interconnect layers than depicted.

In some embodiments, the interconnect structures 1228 may include lines 1228a and/or vias 1228b filled with an electrically conductive material such as a metal. The lines 1228a may be arranged to route electrical signals in a direction of a plane that is substantially parallel with a surface of the die substrate 1202 upon which the device layer 1204 is formed. For example, the lines 1228a may route electrical signals in a direction in and out of the page and/or in a direction across the page from the perspective of FIG. 12. The vias 1228b may be arranged to route electrical signals in a direction of a plane that is substantially perpendicular to the surface of the die substrate 1202 upon which the device layer 1204 is formed. In some embodiments, the vias 1228b may electrically couple lines 1228a of different interconnect layers 1206-1210 together.

The interconnect layers 1206-1210 may include a dielectric material 1226 disposed between the interconnect structures 1228, as shown in FIG. 12. In some embodiments, dielectric material 1226 disposed between the interconnect structures 1228 in different ones of the interconnect layers 1206-1210 may have different compositions; in other embodiments, the composition of the dielectric material 1226 between different interconnect layers 1206-1210 may be the same. The device layer 1204 may include a dielectric material 1226 disposed between the transistors 1240 and a bottom layer of the metallization stack as well. The dielectric material 1226 included in the device layer 1204 may have a different composition than the dielectric material 1226 included in the interconnect layers 1206-1210; in other embodiments, the composition of the dielectric material 1226 in the device layer 1204 may be the same as a dielectric material 1226 included in any one of the interconnect layers 1206-1210.

A first interconnect layer 1206 (referred to as Metal 1 or "M1") may be formed directly on the device layer 1204. In some embodiments, the first interconnect layer 1206 may include lines 1228a and/or vias 1228b, as shown. The lines 1228a of the first interconnect layer 1206 may be coupled with contacts (e.g., the S/D contacts 1224) of the device layer 1204. The vias 1228b of the first interconnect layer 1206 may be coupled with the lines 1228a of a second interconnect layer 1208.

The second interconnect layer 1208 (referred to as Metal 2 or "M2") may be formed directly on the first interconnect layer 1206. In some embodiments, the second interconnect layer 1208 may include via 1228b to couple the lines 1228 of the second interconnect layer 1208 with the lines 1228a of a third interconnect layer 1210. Although the lines 1228a and the vias 1228b are structurally delineated with a line within the individual interconnect layers for the sake of clarity, the lines 1228a and the vias 1228b may be structurally and/or materially contiguous (e.g., simultaneously filled during a dual-damascene process) in some embodiments.

The third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206. In some embodiments, the interconnect layers that are "higher up" in the metallization stack 1219 in the integrated circuit device 1200 (i.e., farther away from the device layer 1204) may be thicker than the interconnect layers that are lower in the metallization stack 1219, with lines 1228a and vias 1228b in the higher interconnect layers being thicker than those in the lower interconnect layers.

The integrated circuit device 1200 may include a solder resist material 1234 (e.g., polyimide or similar material) and one or more conductive contacts 1236 formed on the interconnect layers 1206-1210. In FIG. 12, the conductive contacts 1236 are illustrated as taking the form of bond pads. The conductive contacts 1236 may be electrically coupled with the interconnect structures 1228 and configured to route the electrical signals of the transistor(s) 1240 to external devices. For example, solder bonds may be formed on the one or more conductive contacts 1236 to mechanically and/or electrically couple an integrated circuit die including the integrated circuit device 1200 with another component (e.g., a printed circuit board). The integrated circuit device 1200 may include additional or alternate structures to route the electrical signals from the interconnect layers 1206-1210; for example, the conductive contacts 1236 may include other analogous features (e.g., posts, pins, pillars) that route the electrical signals to external components. The conductive contacts 1236 may serve as the conductive contacts illustrated and described in the various embodiments disclosed herein, as appropriate.

In some embodiments in which the integrated circuit device 1200 is a double-sided die, the integrated circuit device 1200 may include another metallization stack (not shown) on the opposite side of the device layer(s) 1204. This metallization stack may include multiple interconnect layers as discussed above with reference to the interconnect layers 1206-1210, to provide conductive pathways (e.g., including conductive lines and vias) between the device layer(s) 1204 and additional conductive contacts (not shown) on the opposite side of the integrated circuit device 1200 from the conductive contacts 1236. These additional conductive contacts may serve as the conductive contacts illustrated and described in the various embodiments disclosed herein, as appropriate.

In other embodiments in which the integrated circuit device 1200 is a double-sided die, the integrated circuit device 1200 may include one or more through silicon vias (TSVs) through the die substrate 1202; these TSVs may make contact with the device layer(s) 1204, and may provide conductive pathways between the device layer(s) 1204 and additional conductive contacts (not shown) on the opposite side of the integrated circuit device 1200 from the conductive contacts 1236. These additional conductive contacts may serve as the conductive contacts illustrated and described in the various embodiments disclosed herein, as appropriate. Multiple integrated circuit devices 1200 may be stacked with one or more TSVs in the individual stacked devices to provide connection between from one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 13:
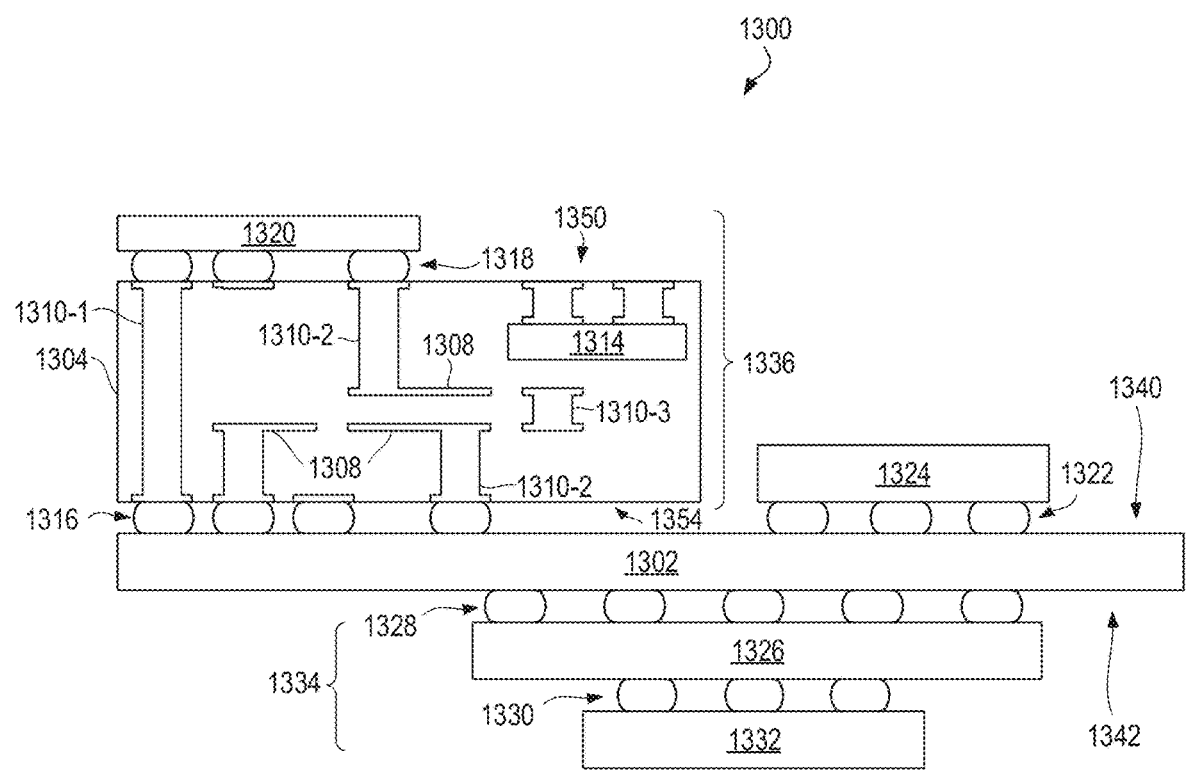
FIG. 13 is a cross-sectional side view of an integrated circuit device assembly that may include a substrate assembly, in accordance with any of the embodiments disclosed herein.

FIG. 13 is a cross-sectional side view of an integrated circuit device assembly 1300 that may include any of the substrate assemblies disclosed herein. In some embodiments, the integrated circuit device assembly 1300 may be a substrate assembly 100. The integrated circuit device assembly 1300 includes a number of components disposed on a circuit board 1302. (which may be a motherboard, system board, or mainboard). The integrated circuit device assembly 1300 includes components disposed on a first face 1340 of the circuit board 1302 and an opposing second face 1342 of the circuit board 1302; generally, components may be disposed on one or both faces 1340 and 1342. Any of the integrated circuit components discussed below with reference to the integrated circuit device assembly 1300 may take the form of any suitable ones of the embodiments of the substrate assemblies or substrate components disclosed herein.

In some embodiments, the circuit board 1302 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate. In some embodiments, the circuit board 1302 may be, for example, the circuit board 440. The integrated circuit device assembly 1300 illustrated in FIG. 13 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 13), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 1316 may serve as the coupling components illustrated or described for any of the substrate assembly or substrate assembly components described herein, as appropriate.

The package-on-interposer structure 1336 may include an integrated circuit component 1320 coupled to an interposer 1304 by coupling components 1318. The coupling components 1318 may take any suitable form for the application, such as the forms discussed above with reference to the coupling components 1316. Although a single integrated circuit component 1320 is shown in FIG. 13, multiple integrated circuit components may be coupled to the interposer 1304; indeed, additional interposers may be coupled to the interposer 1304. The interposer 1304 may provide an intervening substrate used to bridge the circuit board 1302 and the integrated circuit component 1320.

The integrated circuit component 1320 may be a packaged or unpacked integrated circuit product that includes one or more integrated circuit dies (e.g., the die 1102 of FIG. 11, the integrated circuit device 1200 of FIG. 12) and/or one or more other suitable components. The integrated circuit component 1320 can be any integrated circuit component described herein (e.g., integrated circuit component 400). A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1320, a single monolithic integrated circuit die comprises solder bumps attached to contacts on the die. The solder bumps allow the die to be directly attached to the interposer 1304. The integrated circuit component 1320 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1320 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1320 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1320 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1304 may spread connections to a wider pitch or reroute a connection to a different connection. For example, the interposer 1304 may couple the integrated circuit component 1320 to a set of ball grid array (BGA) conductive contacts of the coupling components 1316 for coupling to the circuit board 1302. In the embodiment illustrated in FIG. 13, the integrated circuit component 1320 and the circuit board 1302 are attached to opposing sides of the interposer 1304; in other embodiments, the integrated circuit component 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through hole vias 1310-1 (that extend from a first face 1350 of the interposer 1304 to a second face 1354 of the interposer 1304), blind vias 1310-2 (that extend from the first or second faces 1350 or 1354 of the interposer 1304 to an internal metal interconnect), and buried vias 1310-3 (that connect metal interconnects at different layers).

In some embodiments, the interposer 1304 can comprise a silicon interposer. Through silicon vias (TSV) extending through the silicon interposer can connect connections on a first face of a silicon interposer to an opposing second face of the silicon interposer. In some embodiments, an interposer 1304 comprising a silicon interposer can further comprise one or more routing layers to route connections on a first face of the interposer 1304 to an opposing second face of the interposer 1304.

The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art. In embodiments where the interposer is a non-printed circuit board The integrated circuit device assembly 1300 may include an integrated circuit component 1324 coupled to the first face 1340 of the circuit board 1302 by coupling components 1322. The coupling components 1322 may take the form of any of the embodiments discussed above with reference to the coupling; components 1316, and the integrated circuit component 1324 may take the form of any of the embodiments discussed above with reference to the integrated circuit component 1320.

The integrated circuit device assembly 1300 illustrated in FIG. 13 includes a package-on-package structure 1334 coupled to the second face 1342 of the circuit board 1302 by coupling components 1328. The package-on-package structure 1334 may include an integrated circuit component 1326 and an integrated circuit component 1332 coupled together by coupling components 1330 such that the integrated circuit component 1326 is disposed between the circuit board 1302 and the integrated circuit component 1332. The coupling components 1328 and 1330 may take the form of any of the embodiments of the coupling components 1316 discussed above, and the integrated circuit components 1326 and 1332 may take the form of any of the embodiments of the integrated circuit component 1320 discussed above. The package-on-package structure 1334 may be configured in accordance with any of the package-on-package structures known in the art.

Figure 14:
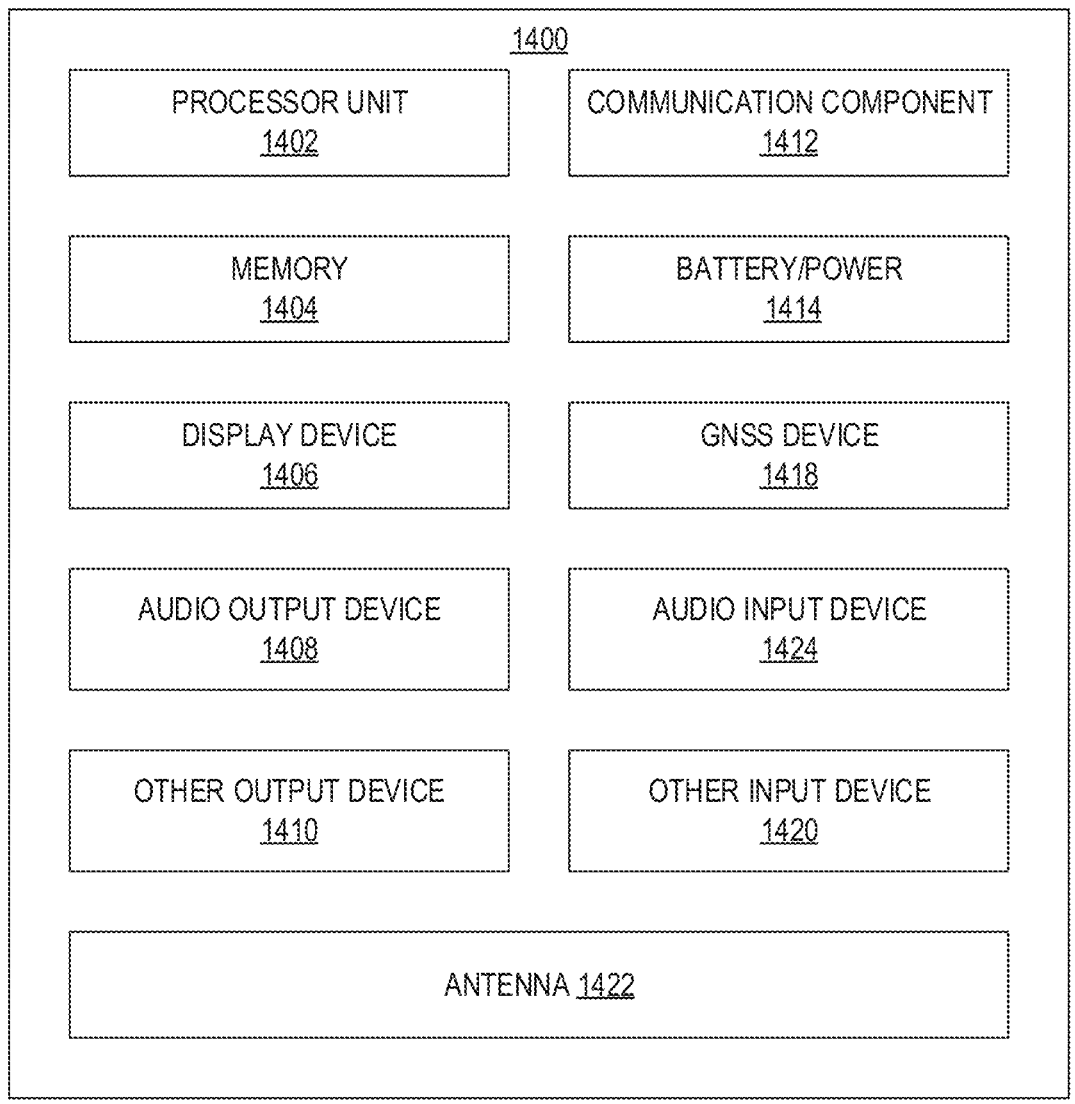
FIG. 14 is a block diagram of an example processing device that may include a substrate assembly, in accordance with any of the embodiments disclosed herein.

FIG. 14 is a block diagram of an example electrical device 1400 that may include one or more of the substrate assemblies disclosed herein. For example, any suitable ones of the components of the electrical device 1400 may include one or more of the integrated circuit device assemblies 1300, integrated circuit components 1320, integrated circuit devices 1200, or integrated circuit dies 1102 disclosed herein, and may be arranged in any of the substrate assemblies 100 disclosed herein. A number of components are illustrated in FIG. 14 as included in the electrical device 1400, but any one or more of these components may be omitted or duplicated, as suitable for the application. In some embodiments, some or all of the components included in the electrical device 1400 may be attached to one or more motherboards mainboards, or system boards. In some embodiments, one or more of these components are fabricated onto a single system-on-a-chip (SoC) die.

Additionally, in various embodiments, the electrical device 1400 may not include one or more of the components illustrated in FIG. 14, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include one or more processor units 1402 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1402 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1400 may include a memory 1404, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1404 may include memory that is located on the same integrated circuit die as the processor unit 1402. This memory may be used as cache memory (e.g., Level 1 (L1), Level 2 (L2), Level 3 (L3), 4 (L4), Last Level Cache (LLC)) and may include embedded dynamic random access memory (eDRAM) or spin transfer torque magnetic random access memory (STT-MRAM).

In some embodiments, the electrical device 1400 can comprise one or more processor units 1402 that are heterogeneous or asymmetric to another processor unit 1402 in the electrical device 1400. There can be a variety of differences between the processing units 1402 in a system in terms of a spectrum of metrics of merit including architectural, microarchitectural, thermal, power consumption characteristics, and the like. These differences can effectively manifest themselves as asymmetry and heterogeneity among the processor units 1402 in the electrical device 1400.

In some embodiments, the electrical device 1400 may include a communication component 1412 (e.g., one or more communication components). For example, the communication component 1412 can manage wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1412 may implement any of a number of wireless standards or protocols, including but not limited to Institute for Electrical and Electronic Engineers (IEEE) standards including Wi-Fi (IEEE 1302.11 family), IEEE 1302.16 standards (e.g., IEEE 1302.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 1302.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1302.16 standards. The communication component 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication component 1412 may manage wired communications, such as electrical, optical, or any other suitable communication protocols (e.g., IEEE 1302.3 Ethernet standards). As noted above, the communication component 1412 may include multiple communication components. For instance, a first communication component 1412 may be dedicated to shorter-range wireless communications such as Wi-Fi or Bluetooth, and a second communication component 1412 may be dedicated to longer-range wireless communications such as global positioning system (GPS), EDGE, GPRS, CDMA, WiMAX, LTE, EV-DO, or others. In some embodiments, a first communication component 1412 may be dedicated to wireless communications, and a second communication component 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any embedded or wired or wirelessly connected external device that generates an audible indicator, such speakers, headsets, or earbuds.

The electrical device 1400 may include an audio input device 1424 (or corresponding interface circuitry, as discussed above). The audio input device 1424 may include any embedded or wired or wirelessly connected device that generates a signal representative of a sound, such as microphones, microphone arrays, or digital instruments (e.g., instruments having a musical instrument digital interface (MIDI) output). The electrical device 1400 may include a Global Navigation Satellite System (GNSS) device 1418 (or corresponding interface circuitry, as discussed above), such as a Global Positioning System (GPS) device. The GNSS device 1418 may be in communication with a satellite-based system and may determine a geolocation of the electrical device 1400 based on information received from one or more GNSS satellites, as known in the art.

The electrical device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include an other input device 1420 (or corresponding interface circuitry, as discussed above). Examples of the other input device 1420 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFD) reader.

The electrical device 1400 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1400 may be any other electronic device that processes data. In some embodiments, the electrical device 1400 may comprise multiple discrete physical components. Given the range of devices that the electrical device 1400 can be manifested as in various embodiments, in some embodiments, the electrical device 1400 can be referred to as a computing device or a computing system.

The following examples pertain to additional embodiments of technologies disclosed herein.

Example 1 is an apparatus comprising: a first substrate component comprising: a plurality of first conductive contacts located on a face of the first substrate component; one or more first interconnect layers comprising conductive traces; and one or more first dielectric layers, individual of the first interconnect layers disposed between adjacent first dielectric layers; a second substrate component comprising: one or more second dielectric layers; a plurality of first coupling components comprising liquid metal; a plurality of second coupling components comprising liquid metal; and a plurality of through holes extending through the second dielectric layers, individual of through holes having a first coupling component disposed at a first end of the individual through hole and a second coupling component disposed at a second end of the individual through hole that opposes the first end of the individual through hole; and a third substrate component comprising: a plurality of second conductive contacts located on a face of the third substrate component; one or more second interconnect layers comprising conductive traces; and one or more third dielectric layers, individual of the second interconnect layers disposed between adjacent third dielectric layers; wherein the plurality of the first coupling components connect to the plurality of the first conductive contacts; wherein the plurality of the second coupling components connect to the plurality of the second conductive contacts; and wherein the second substrate component is disposed between the first substrate component and the third substrate component.

Example 2 comprises the apparatus of claim 1, the apparatus further comprising an integrated circuit die attached to the first substrate component via a third plurality of coupling components.

Example 3 comprises the apparatus of claim 2, wherein the integrated circuit die is a first integrated circuit die, the apparatus further comprising a second integrated circuit die attached to the first substrate component by a fourth plurality of coupling components.

Example 4 comprises the apparatus of claim 2, wherein the first substrate component, the second substrate component, the third substrate component, and the integrated circuit die are part of a packaged integrated circuit component.

Example 5 comprises the apparatus of any one of claims 1-4, wherein the second substrate component further comprises one or more third interconnect layers comprising conductive traces, individual of the third interconnect layers disposed between adjacent second dielectric layers.

Example 6 comprises the apparatus of one of claims 1-5, wherein the face of the first substrate component is a first face of the first substrate component, the first substrate component further comprising a third conductive contact and a fourth conductive contact on a second face of the first substrate component that opposes the first face of the first substrate component, the first substrate component further comprising: a bridge embedded within the first substrate component, the bridge comprising one or more bridge conductive traces; and one or more substrate vias; wherein the one or more substrate vias and the one or more bridge conductive traces comprise at least part of a conductive path from the third conductive contact to the fourth conductive contact.

Example 7 comprises the apparatus of one of claims 1-6, wherein an x-y area of the second substrate component is less than an x-y area of the third substrate component.

Example 8 comprises the apparatus of one of claims 1-7, wherein one of the through holes is at least partially filled with liquid metal.

Example 9 comprises the apparatus of claim 8, wherein the one of the through holes is surrounded by a plug comprising a magnetic material.

Example 10 comprises the apparatus of claim 9, wherein the one of the through holes is substantially coaxially aligned with the plug.

Example 11 comprises the apparatus of any one of claims 1-10, wherein at least one of the through holes is a plated through hole.

Example 12 comprises the apparatus of any one of claims 1-11, wherein at least one of the through holes is at least partially filled with copper.

Example 13 comprises the apparatus of any one of claims 1-12, wherein individual of the first conductive contacts comprises a copper protrusion that connects with one of the first coupling components.

Example 14 comprises the apparatus of any one of claims 1-13, wherein the liquid metal comprises gallium.

Example 15 is an electrical device comprising: a printed circuit board; and an integrated circuit component attached to the printed circuit board, the integrated circuit component comprising: a first substrate component comprising: a plurality of first conductive contacts located on a face of the first substrate component; one or more first interconnect layers comprising conductive traces; and one or more first dielectric layers, individual of the first interconnect layers disposed between adjacent first dielectric layers; a second substrate component comprising: one or more second dielectric layers; a plurality of first coupling components comprising liquid metal; a plurality of second coupling components comprising liquid metal; and a plurality of through holes extending through the second dielectric layers, individual of through holes having a first coupling component disposed at a first end of the individual through hole and a second coupling component disposed at a second end of the individual through hole that opposes the first end of the individual through hole; a third substrate component comprising: a plurality of second conductive contacts located on a face of the third substrate component; one or more second interconnect layers comprising conductive traces; and one or more third dielectric layers, individual of the second interconnect layers located between adjacent third dielectric layers; and one or more integrated circuit dies attached to the first substrate component; wherein the plurality of the first coupling components connect to the plurality of the first conductive contacts; wherein the plurality of the second coupling components connect to the plurality of the second conductive contacts; and wherein the second substrate component is located between the first substrate component and the third substrate component.

Example 16 comprises the electrical device of claim 15, wherein the printed circuit board is attached to the integrated circuit component via a socket.

Example 17 comprises the electrical device of claim 15 or 16, wherein the integrated circuit component is communicatively coupled to at least one memory via the printed circuit board.

Example 18 comprises the electrical device of any one of claims 1-17, wherein the electrical device comprises a housing, the integrated circuit component located within the housing.

Example 19 comprises the electrical device of any one of claims 1-18, wherein the one or more integrated circuit dies comprise two types of integrated circuit dies.

Example 20 comprises the electrical device of any one of claims 1-19, wherein the second substrate component further comprises one or more third interconnect layers comprising conductive traces, individual of the third interconnect layers disposed between adjacent second dielectric layers.

Example 21 comprises the electrical device of any one of claims 1-20, wherein the face of the first substrate component is a first face of the first substrate component, the first substrate component further comprising a third conductive contact and a fourth conductive contact on a second face of the first substrate component that is opposite the first face of the first substrate component, the first substrate component further comprising: a bridge embedded within the first substrate component, the bridge comprising one or more bridge conductive traces; and one or more substrate vias; wherein the one or more substrate vias and the one or more bridge conductive traces comprise at least part of a conductive path from the third conductive contact to the fourth conductive contact via the bridge.

Example 22 comprises the electrical device of any one of claims 1-22, wherein one of the through holes is at least partially filled with liquid metal.

Example 23 comprises the electrical device of claim 22, wherein the one of the through holes is surrounded by a plug comprising a magnetic material.

Example 24 comprises the electrical device of claim 23, wherein the one of the through holes is substantially coaxially aligned with the plug.

Example 25 comprises the electrical device of any one of claims 1-24, wherein at least one of the through holes is a plated through hole.

Example 26 comprises the electrical device of any one of claims 1-25, wherein at least one of the through holes is at least partially filled with copper.

Example 27 comprises the electrical device of any one of claims 1-26, wherein individual of the first conductive contacts comprises a copper protrusion that connects with one of the first coupling components.

Example 22 comprises the electrical device of any one of claims 1-27, wherein the liquid metal comprises gallium.

Example 29 is a method comprising: attaching a first substrate component to a second substrate component; and attaching a third substrate component to the second substrate component; wherein the first substrate component comprises: a plurality of first conductive contacts located on a face of the first substrate component; one or more first interconnect layers comprising conductive traces; one or more first dielectric layers, individual of the first interconnect layers disposed between adjacent first dielectric layers; and wherein the second substrate component comprises: one or more second dielectric layers; a plurality of first coupling components comprising liquid metal; a plurality of second coupling components comprising liquid metal; and a plurality of through holes extending through the second dielectric layers, individual of through holes having a first coupling component disposed at a first end of the individual through hole and a second coupling component disposed at a second end of the individual through hole that opposes the first end of the individual through hole; and wherein the third substrate component comprises: a plurality of second conductive contacts located on a face of the third substrate component; one or more second interconnect layers comprising conductive traces; one or more third dielectric layers, individual of the second interconnect layers disposed between adjacent third dielectric layers; wherein the plurality of the first coupling components connect to the plurality of the first conductive contacts; wherein the plurality of the second coupling components connect to the plurality of the second conductive contacts; and wherein the second substrate component is disposed between the first substrate component and the third substrate component; and wherein the first substrate component, the second substrate component, and the third substrate component form a substrate assembly when attached together.

Example 30 comprises the method of claim 29, further comprising attaching one or more integrated circuit dies to the substrate assembly.

Example 31 comprises the method of claim 30, further comprising packaging the one or more integrated circuit dies and the substrate assembly.

Example 32 comprises the method of any one of claims 29-31, further comprising: detaching the first substrate component from the second substrate component without an application of heat to enable the detaching; and attaching a different first substrate component to the second substrate component to replace the first substrate component.

Example 33 comprises the method of any one of claims 29-32, further comprising: detaching the third substrate component from the first substrate component without an application of heat to enable the detaching; and attaching a different third substrate component to the second substrate component to replace the first substrate component.

Example 34 is a method comprising: drilling a first hole through a circuit board comprising a plurality of dielectric layers, the first hole extending through the plurality of dielectric layers; filling the first hole with a first plug comprising magnetic material; drilling a second hole through the first plug; and filling the second hole with a second plug comprising liquid metal, the second plug surrounded by and substantially coaxially aligned with the first plug.

Example 35 comprises the method of claim 34, wherein the first hole comprises a wall, the method further comprising plating the wall with a layer comprising copper.

Example 36 comprises the method of claim 34 or 35, further comprising printing a coupling component comprising liquid metal on the first face of the circuit board, the coupling component disposed at an end of the second plug.

Example 37 comprises the method of any one of claims 34-36, wherein the circuit board comprises a first face and a second face opposing the first face, the method further comprising: printing a first coupling component comprising liquid metal on the first face of the circuit board; and printing a second coupling component comprising liquid metal on second face of the circuit board, the first coupling component disposed at a first end of the second plug and the second coupling component disposed at a second end of the second plug.

Example 38 is a substrate component comprising: a circuit board comprising one or more dielectric layers; a plurality of first coupling components comprising liquid metal; a plurality of second coupling components comprising liquid metal; and a plurality of through holes extending through the dielectric layers, individual of through holes having one of the first coupling components disposed at a first end of the individual through hole and one of the second coupling components disposed at a second end of the individual through hole that opposes the first end of the individual through hole.

Example 39 comprises the substrate component of claim 38, further comprising one or more interconnect layers comprising conductive traces, individual of the interconnect layers disposed between adjacent dielectric layers.

Example 40 comprises the substrate component of claim 38 or 39, wherein one of the through holes is at least partially filled with liquid metal.

Example 41 comprises the substrate component of any one of claims 38-40, wherein the one of the through holes is surrounded by a plug comprising a magnetic material.

Example 42 comprises the substrate component of claim 41, wherein the one of the through holes is substantially coaxially aligned with the plug.

Example 43 comprises the substrate component of any one of claims 38-42, wherein at least one of the through holes is a plated through hole.

Example 44 comprises the substrate component of any one of claims 38-43, wherein at least one of the through holes is at least partially filled with copper.

Example 45 comprises the substrate component of any one of claims 38-44, wherein the liquid metal comprises gallium.

The invention claimed is:

1. An apparatus comprising:
 a first substrate component comprising:
  a plurality of first conductive contacts located on a face of the first substrate component;
  one or more first interconnect layers comprising conductive traces; and
  one or more first dielectric layers, individual of the first interconnect layers disposed between adjacent first dielectric layers;
 a second substrate component comprising:
  one or more second dielectric layers;
  a plurality of first coupling components comprising liquid metal;
  a plurality of second coupling components comprising liquid metal; and
  a plurality of through holes extending through the second dielectric layers, individual of through holes having a first coupling component disposed at a first end of the individual through hole and a second coupling component disposed at a second end of the individual through hole that opposes the first end of the individual through hole; and
 a third substrate component comprising:
  a plurality of second conductive contacts located on a face of the third substrate component;
  one or more second interconnect layers comprising conductive traces; and
  one or more third dielectric layers, individual of the second interconnect layers disposed between adjacent third dielectric layers;
 wherein the plurality of the first coupling components connect to the plurality of the first conductive contacts;
 wherein the plurality of the second coupling components connect to the plurality of the second conductive contacts; and
 wherein the second substrate component is disposed between the first substrate component and the third substrate component.

2. The apparatus of claim 1, the apparatus further comprising an integrated circuit die attached to the first substrate component via a third plurality of coupling components.

3. The apparatus of claim 1, wherein the face of the first substrate component is a first face of the first substrate component, the first substrate component further comprising a third conductive contact and a fourth conductive contact on a second face of the first substrate component that opposes the first face of the first substrate component, the first substrate component further comprising:
 a bridge embedded within the first substrate component, the bridge comprising one or more bridge conductive traces; and
 one or more substrate vias;
 wherein the one or more substrate vias and the one or more bridge conductive traces comprise at least part of a conductive path from the third conductive contact to the fourth conductive contact.

4. The apparatus of claim 1, wherein one of the through holes is at least partially filled with liquid metal.

5. The apparatus of claim 4, wherein the one of the through holes is surrounded by a plug comprising a magnetic material.

6. The apparatus of claim 5, wherein the one of the through holes is substantially coaxially aligned with the plug.

7. The apparatus of claim 1, wherein individual of the first conductive contacts comprises a copper protrusion that connects with one of the first coupling components.

8. An electrical device comprising:
 a printed circuit board; and
 an integrated circuit component attached to the printed circuit board, the integrated circuit component comprising:
  a first substrate component comprising:
   a plurality of first conductive contacts located on a face of the first substrate component;
   one or more first interconnect layers comprising conductive traces; and
   one or more first dielectric layers, individual of the first interconnect layers disposed between adjacent first dielectric layers;
  a second substrate component comprising:
   one or more second dielectric layers;
   a plurality of first coupling components comprising liquid metal;
   a plurality of second coupling components comprising liquid metal; and
   a plurality of through holes extending through the second dielectric layers, individual of through holes having a first coupling component disposed at a first end of the individual through hole and a second coupling component disposed at a second end of the individual through hole that opposes the first end of the individual through hole;
  a third substrate component comprising:
   a plurality of second conductive contacts located on a face of the third substrate component;
   one or more second interconnect layers comprising conductive traces; and
   one or more third dielectric layers, individual of the second interconnect layers located between adjacent third dielectric layers; and
  one or more integrated circuit dies attached to the first substrate component;
 wherein the plurality of the first coupling components connect to the plurality of the first conductive contacts;
 wherein the plurality of the second coupling components connect to the plurality of the second conductive contacts; and
 wherein the second substrate component is located between the first substrate component and the third substrate component.

9. The electrical device of claim 8, wherein the printed circuit board is attached to the integrated circuit component via a socket.

10. The electrical device of claim 8, wherein the integrated circuit component is communicatively coupled to at least one memory via the printed circuit board.

11. The electrical device of claim 8, wherein the electrical device comprises a housing, the integrated circuit component located within the housing.

12. The electrical device of claim 8, wherein the one or more integrated circuit dies comprise two types of integrated circuit dies.

13. The electrical device of claim 8, wherein the face of the first substrate component is a first face of the first substrate component, the first substrate component further comprising a third conductive contact and a fourth conductive contact on a second face of the first substrate component that is opposite the first face of the first substrate component, the first substrate component further comprising:
a bridge embedded within the first substrate component, the bridge comprising one or more bridge conductive traces; and
one or more substrate vias;
wherein the one or more substrate vias and the one or more bridge conductive traces comprise at least part of a conductive path from the third conductive contact to the fourth conductive contact via the bridge.

14. The electrical device of claim 8, wherein one of the through holes is at least partially filled with liquid metal.

15. The electrical device of claim 14, wherein the one of the through holes is surrounded by a plug comprising a magnetic material.

16. The electrical device of claim 15, wherein the one of the through holes is substantially coaxially aligned with the plug.

17. A method comprising:
attaching a first substrate component to a second substrate component; and
attaching a third substrate component to the second substrate component;
wherein the first substrate component comprises:
a plurality of first conductive contacts located on a face of the first substrate component;
one or more first interconnect layers comprising conductive traces;
one or more first dielectric layers, individual of the first interconnect layers disposed between adjacent first dielectric layers; and
wherein the second substrate component comprises:
one or more second dielectric layers;
a plurality of first coupling components comprising liquid metal;
a plurality of second coupling components comprising liquid metal; and
a plurality of through holes extending through the second dielectric layers, individual of through holes having a first coupling component disposed at a first end of the individual through hole and a second coupling component disposed at a second end of the individual through hole that opposes the first end of the individual through hole; and
wherein the third substrate component comprises:
a plurality of second conductive contacts located on a face of the third substrate component;
one or more second interconnect layers comprising conductive traces;
one or more third dielectric layers, individual of the second interconnect layers disposed between adjacent third dielectric layers;
wherein the plurality of the first coupling components connect to the plurality of the first conductive contacts;
wherein the plurality of the second coupling components connect to the plurality of the second conductive contacts; and
wherein the second substrate component is disposed between the first substrate component and the third substrate component; and
wherein the first substrate component, the second substrate component, and the third substrate component form a substrate assembly when attached together.

18. The method of claim 17, further comprising attaching one or more integrated circuit dies to the substrate assembly.

19. The method of claim 17, further comprising:
detaching the first substrate component from the second substrate component without an application of heat to enable the detaching; and
attaching a different first substrate component to the second substrate component to replace the first substrate component.

20. The method of claim 17, further comprising:
detaching the third substrate component from the first substrate component without an application of heat to enable the detaching; and
attaching a different third substrate component to the second substrate component to replace the first substrate component.

21. A substrate component comprising:
a circuit board comprising one or more dielectric layers;
a plurality of first coupling components comprising liquid metal;
a plurality of second coupling components comprising liquid metal; and
a plurality of through holes extending through the dielectric layers, individual of through holes having one of the first coupling components disposed at a first end of the individual through hole and one of the second coupling components disposed at a second end of the individual through hole that opposes the first end of the individual through hole.

22. The substrate component of claim 21, further comprising one or more interconnect layers comprising conductive traces, individual of the interconnect layers disposed between adjacent dielectric layers.

23. The substrate component of claim 21, wherein one of the through holes is at least partially filled with liquid metal.

24. The substrate component of claim 23, wherein the one of the through holes is surrounded by a plug comprising a magnetic material.

25. The substrate component of claim 24, wherein the one of the through holes is substantially coaxially aligned with the plug.

* * * * *